(12) United States Patent
Fujita et al.

(10) Patent No.: US 7,825,409 B2
(45) Date of Patent: Nov. 2, 2010

(54) GAN CRYSTAL SUBSTRATE

(75) Inventors: Shunsuke Fujita, Itami (JP); Hitoshi Kasai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 596 days.

(21) Appl. No.: 11/730,649

(22) Filed: Apr. 3, 2007

(65) Prior Publication Data
US 2007/0228400 A1 Oct. 4, 2007

(30) Foreign Application Priority Data
Apr. 3, 2006 (JP) ............... 2006-102158
Feb. 2, 2007 (JP) ............... 2007-024377

(51) Int. Cl.
*H01L 23/58* (2006.01)
(52) U.S. Cl. .......................... 257/48; 117/902
(58) Field of Classification Search ................ 117/107, 117/902, 913, 923, 924; 257/48
See application file for complete search history.

(56) References Cited

U.S. PATENT DOCUMENTS

| 5,212,151 | A | * | 5/1993 | Takano et al. ............... 505/126 |
| 6,004,405 | A | | 12/1999 | Oishi et al. |
| 2002/0185054 | A1 | * | 12/2002 | Xu et al. ......................... 117/2 |
| 2004/0135232 | A1 | * | 7/2004 | Bakel et al. ................... 257/620 |
| 2004/0188804 | A1 | * | 9/2004 | Nakayama et al. .......... 257/620 |
| 2004/0221799 | A1 | * | 11/2004 | Nakayama et al. ............ 117/94 |

FOREIGN PATENT DOCUMENTS

| EP | 1 463 115 A2 | 9/2004 |
| EP | 1 821 339 A1 | 8/2007 |
| JP | 61-290708 | 12/1986 |
| JP | 2002-222746 | 8/2002 |
| JP | 2002-356398 | 12/2002 |
| JP | 2004-335645 | 11/2004 |
| JP | 2004335645 | * 11/2004 |
| JP | 2007-049047 | 2/2007 |

OTHER PUBLICATIONS

Extended European Search Report issued in European Patent Application No. EP 07005725.2-1215/1842942, dated May 25, 2009.

* cited by examiner

*Primary Examiner*—Kiesha R Bryant
*Assistant Examiner*—Ali Naraghi
(74) *Attorney, Agent, or Firm*—McDermott Will & Emery LLP

(57) ABSTRACT

A GaN crystal substrate has a crystal growth surface on which a crystal is grown, and a rear surface opposite to the crystal growth surface. The crystal growth surface has a roughness $Ra_{(C)}$ of at most 10 nm, and the rear surface has a roughness $Ra_{(R)}$ of at least 0.5 μm and at most 10 μm. A ratio $Ra_{(R)}/Ra_{(C)}$ of the surface roughness $Ra_{(R)}$ to the surface roughness $Ra_{(C)}$ is at least 50. Thus, a GaN crystal substrate of which front and rear surfaces are distinguishable from each other is provided, without impairing the morphology of a semiconductor layer grown on the GaN crystal substrate.

4 Claims, 10 Drawing Sheets

GAN CRYSTAL SUBSTRATE

BACKGROUND OF THE INVENTION

1. Field of the Invention

The present invention relates to a GaN crystal substrate used in a semiconductor device and the like, and particularly to a GaN crystal substrate of which front and rear surfaces are distinguishable from each other.

2. Description of the Background Art

A GaN crystal substrate is widely used as a substrate for a semiconductor device such as a light emitting device, an electronic device, or a semiconductor sensor. Here, by forming at least one semiconductor layer on a surface of a GaN crystal substrate on which a crystal is grown (also referred to as a crystal growth surface or front surface, hereinafter the same applies), a semiconductor device is formed. Accordingly, in order to manufacture a semiconductor device, it has been necessary to distinguish between the front surface and rear surface (which is a surface opposite to the crystal growth surface, hereinafter the same applies) of a GaN crystal substrate.

By dividing a wafer that includes a GaN crystal substrate and at least one semiconductor layer formed on the front surface thereof along a prescribed crystal orientation, each semiconductor device chip can be obtained. Accordingly, it has also been necessary to identify crystal orientation in order to manufacture a semiconductor device.

In order to distinguish between the front and rear surfaces of such a GaN crystal substrate, it has conventionally been necessary to form at least two orientation flats. In order to identify the crystal orientation of a GaN crystal substrate, at least one orientation flat has been formed in parallel with a specific orientation in the substrate (for example, orientation <1-100>) (for example, see Japanese Patent Laying-Open No. 2002-356398).

However, when a semiconductor layer is epitaxially grown on a surface on which crystal is grown of a GaN crystal substrate having such orientation flats formed, the morphology of the semiconductor layer is impaired, e.g., the thickness of the grown semiconductor layer varies between the center of the substrate and a portion near the orientation flats. Although a GaN crystal substrate without such orientation flats does not involve such a problem of impaired morphology of the grown semiconductor layer, the front and rear surfaces cannot be distinguished from each other and/or the crystal orientation cannot be identified.

Accordingly, there has been a desire for development of a GaN crystal substrate of which front and rear surfaces are distinguishable from each other and/or in which the crystal orientation can be identified, without impairing the morphology of a semiconductor layer grown on the GaN crystal substrate.

SUMMARY OF THE INVENTION

An object of the present invention is to provide a GaN crystal substrate of which front and rear surfaces are distinguishable from each other, without impairing the morphology of a semiconductor layer grown on the GaN crystal substrate.

Another object of the present invention is to provide a GaN crystal substrate in which the crystal orientation can be identified, without impairing the morphology of a semiconductor layer grown on the GaN crystal substrate.

The present invention is directed to a GaN crystal substrate, having: a crystal growth surface; and a rear surface opposite to the crystal growth surface. The crystal growth surface has a roughness $Ra_{(C)}$ of at most 10 nm, and the rear surface has a roughness $Ra_{(R)}$ of at least 0.5 μm and at most 10 μm. A ratio $Ra_{(R)}/Ra_{(C)}$ of the surface roughness $Ra_{(R)}$ to the surface roughness $Ra_{(C)}$ is at least 50.

The GaN crystal substrate according to the present invention further includes a laser mark formed at said rear surface. The laser mark may be formed to be indicative of an arbitrarily specified crystal orientation.

The present invention is directed to a GaN crystal substrate including: a matrix crystal region; and a differently oriented crystal region including a crystal that is different in at least one crystal axis from a crystal of the matrix crystal region. The differently oriented crystal region is formed to have a shape indicative of an arbitrarily specified crystal orientation.

In the GaN crystal substrate according to the present invention, the differently oriented crystal region penetrates the substrate in thickness direction. The substrate has a crystal growth surface on which a crystal is grown, and a rear surface opposite to the crystal growth surface. First and second patterns of the differently oriented crystal region appearing on the crystal growth surface and the rear surface of the substrate, respectively, may be different from each other in relation to an outer shape of the substrate. Here, the differently oriented crystal region may be a c-axis reversed crystal region formed by a crystal that is identical to a crystal of the matrix crystal region in a-axis orientation and that is reverse to the crystal of the matrix crystal region in c-axis orientation. The differently oriented crystal region may be a polycrystal region including a plurality of crystals that are different from a crystal of the matrix crystal region in a-axis orientation and that are identical to the crystal of the matrix crystal region in c-axis orientation.

According to the present invention, a GaN crystal substrate of which front and rear surfaces are distinguishable from each other can be provided, without impairing the morphology of a semiconductor layer grown on the GaN crystal substrate. Also, according to the present invention, a GaN crystal substrate in which the crystal orientation can be identified can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
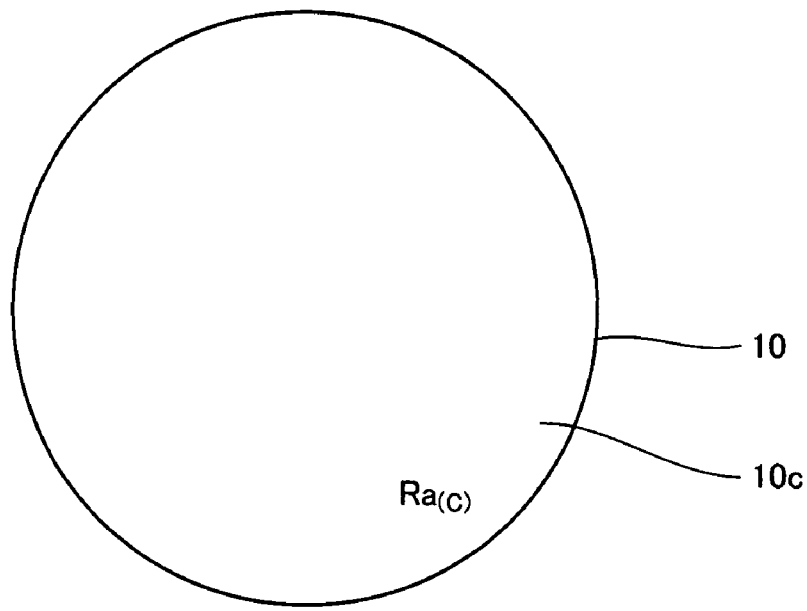
FIG. 1A is a schematic top view showing one embodiment of a GaN crystal substrate according to the present invention.
Figure 1B:
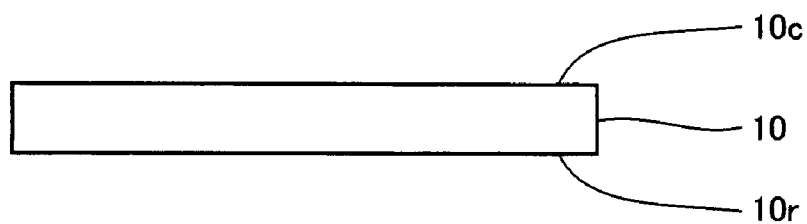
FIG. 1B is a schematic side view corresponding to FIG. 1A.
Figure 1C:
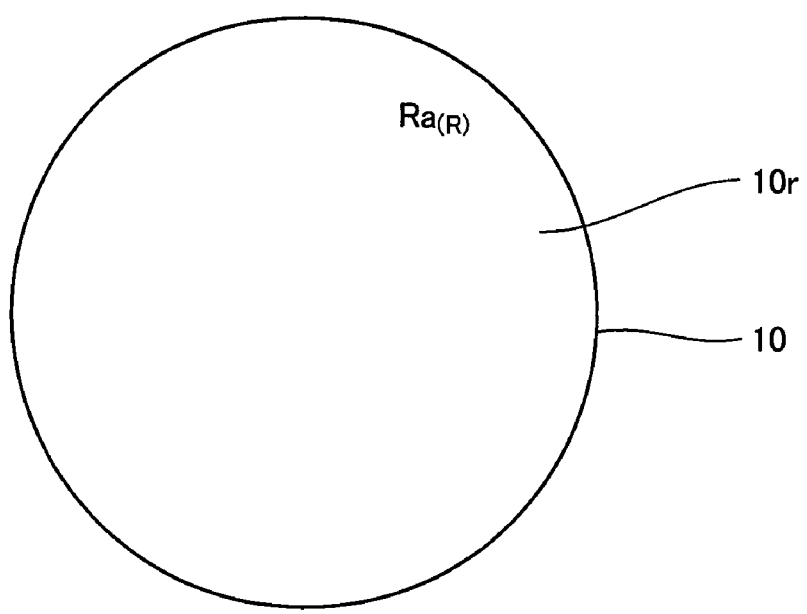
FIG. 1C is a schematic bottom view corresponding to FIG. 1A.

Referring to FIGS. 1A-1C, in an embodiment of a GaN crystal substrate according to the present invention, roughness $Ra_{(C)}$ of a crystal growth surface $10c$ is at most 10 nm while roughness $Ra_{(R)}$ of a rear surface $10r$ opposite to crystal growth surface $10c$ is at least 0.5 µm and at most 10 µm, and a ratio $Ra_{(R)}/Ra_{(C)}$ of surface roughness $Ra_{(R)}$ to surface roughness $Ra_{(C)}$ is at least 50. With a GaN crystal substrate 10 of the present embodiment, the front and rear surfaces of the substrate are easily distinguishable from each other visually, while the morphology of a semiconductor layer grown thereon is not impaired.

It is noted that surface roughness Ra (referring to roughness $Ra_{(C)}$ of crystal growth surface $10c$ and roughness $Ra_{(R)}$ of rear surface $10r$, hereinafter the same applies) is a value obtained by sampling a reference area from a roughness curve in a direction of its mean surface, summing up absolute values of deviations from a mean surface of the sampled portion to a measurement curve, and calculating an average for the reference area. Surface roughness Ra can be measured using a measurement apparatus employing optical interferometry for a surface having small surface roughness, and using a 3D-SEM (three-dimensional scanning electron microscope) for a surface having great surface roughness.

If roughness $Ra_{(C)}$ (hereinafter also referred to as surface roughness $Ra_{(C)}$) of crystal growth surface $10c$ is greater than 10 nm, the morphology of a semiconductor layer grown thereon is impaired. Further, a difference between roughness $Ra_{(R)}$ (hereinafter also referred to as surface roughness $Ra_{(R)}$) of rear surface $10r$ becomes small. Thus, the front and rear surfaces of the substrate cannot easily be distinguished from each other visually. It is noted that surface roughness $Ra_{(C)}$ can be reduced to about 0.1 nm in the current polishing technique.

If roughness $Ra_{(R)}$ of rear surface $10r$ is smaller than 0.5 µm, a difference between roughness $Ra_{(C)}$ of crystal growth surface $10c$ becomes small. Thus, the front and rear surfaces of the substrate cannot easily be distinguished from each other visually. If roughness $Ra_{(R)}$ of rear surface $10r$ is greater than 10 µm, contact between the rear surface of the GaN crystal substrate and a susceptor (which is a table on which the GaN crystal substrate is placed and heated, hereinafter the same applies) becomes uneven when a semiconductor layer is grown on crystal growth surface $10c$ of the GaN crystal substrate. This results in uneven distribution of heat transferred from the susceptor to the GaN crystal substrate and the morphology of the grown semiconductor layer is impaired.

If a ratio $Ra_{(R)}/Ra_{(C)}$ of surface roughness $Ra_{(R)}$ of rear surface $10r$ to surface roughness $Ra_{(C)}$ of crystal growth surface $10c$ is smaller than 50, a difference between $Ra_{(R)}$ and $Ra_{(C)}$ becomes small. Thus, the front and rear surfaces of the substrate cannot easily be distinguished from each other visually.

Second Embodiment

Figure 2A:
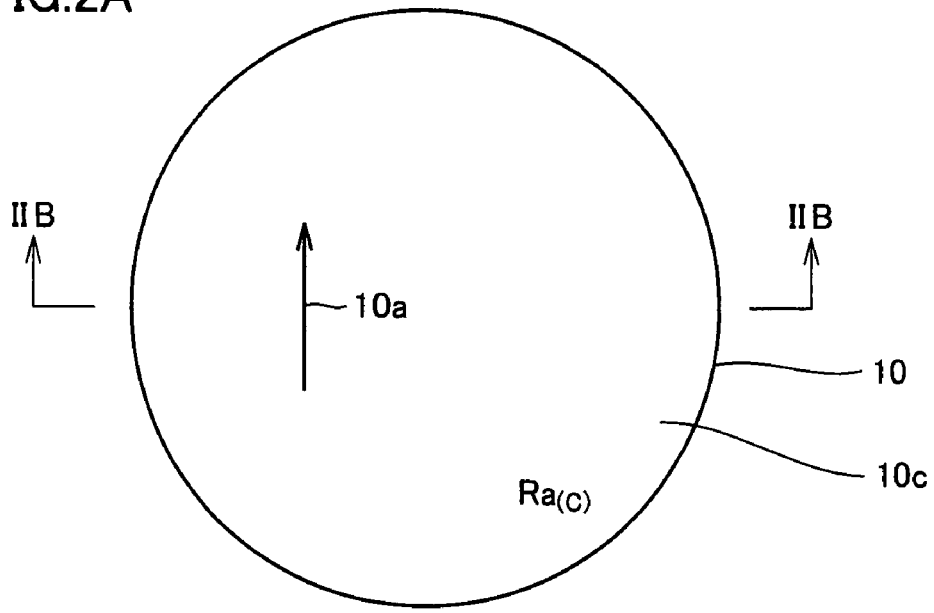
FIG. 2A is a schematic top view showing another embodiment of a GaN crystal substrate according to the present invention.
Figure 2B:
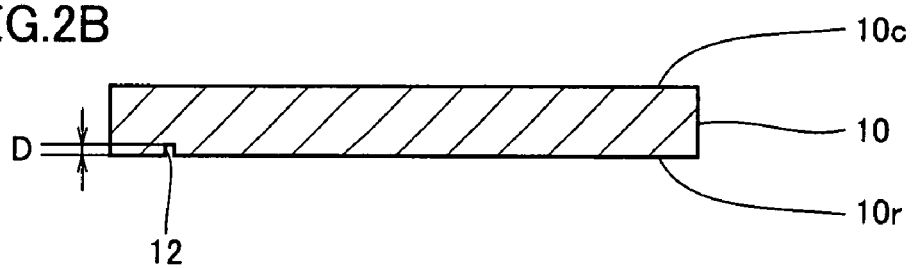
FIG. 2B is a schematic cross-sectional view along IIB in FIGS. 2A and 2C.
Figure 2C:
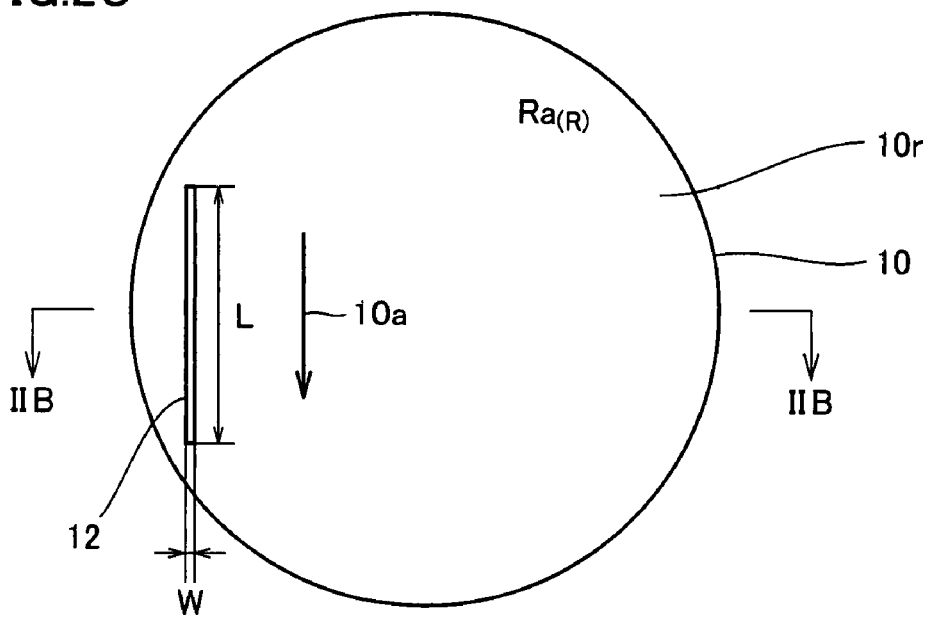
FIG. 2C is a schematic bottom view corresponding to FIG. 2A.

Referring to FIGS. 2A-2C, in another embodiment of a GaN crystal substrate according to the present invention, similarly to the GaN crystal substrate of the first embodiment, roughness $Ra_{(C)}$ of crystal growth surface $10c$ is at most 10 nm while roughness $Ra_{(R)}$ of rear surface $10r$ opposite to crystal growth surface $10c$ is at least 0.5 µm and at most 10 µm, and a ratio $Ra_{(R)}/Ra_{(C)}$ of surface roughness $Ra_{(R)}$ to surface roughness $Ra_{(C)}$ is at least 50. Accordingly, with the GaN crystal substrate of the present embodiment, the front and rear surfaces are easily distinguishable from each other visually.

Further, referring to FIGS. 2A-2C, GaN crystal substrate 10 of the present embodiment includes a laser mark 12 formed at its rear surface $10r$. Laser mark 12 is formed to be indicative of an arbitrarily specified crystal orientation $10a$. As laser mark 12 is formed at rear surface $10r$ of GaN crystal substrate 10, a semiconductor layer being excellent in morphology can be grown on crystal growth surface $10c$. As laser mark 12 is formed to be indicative of arbitrarily specified crystal orientation 10a of GaN crystal substrate 10, arbitrarily specified crystal orientation 10a of GaN crystal substrate 10 can be identified.

Here, referring to FIGS. 2A-2C, a method of forming laser mark 12 to be indicative of arbitrarily specified crystal orientation 10a of GaN crystal substrate 10 is not specifically limited. By forming laser mark 12 linearly at rear surface 10r of GaN crystal substrate 10 in parallel with, for example, orientation <1-100> or orientation <11-20> as arbitrarily specified crystal orientation 10a of GaN crystal substrate 10, crystal orientation <1-100> or <11-20> can be identified, respectively.

While laser mark 12 is formed not at crystal growth surface 10c but at rear surface 10r and therefore its shape is not specifically limited, it is preferable that width W is at least 30 μm and at most 1000 μm, depth D is at least 5 μm and at most 30 μm and that length L is at least 5 mm and at most 20 mm. If width W is smaller than 30 μm, the front and rear surfaces of the substrate cannot easily be distinguished from each other visually. If it is greater than 1000 μm, contact between rear surface 10r of the GaN crystal substrate and a susceptor (which is a table for holding the GaN crystal substrate, the surface of which is in contact with the rear surface of the substrate and serves to heat the substrate, hereinafter the same applies) becomes poor when an epitaxial crystal is grown on the crystal growth surface of the substrate. Thus, an excellent epitaxial crystal can hardly be obtained. If depth D is smaller than 5 μm, the front and rear surfaces of the substrate cannot easily be distinguished from each other visually. When it is greater than 30 μm, the substrate is prone to crack. If length L is smaller than 5 mm, misalignment is likely to occur in aligning to a prescribed orientation. If it is greater than 20 mm, contact between rear surface 10r of the substrate and the susceptor becomes poor when an epitaxial crystal is grown on crystal growth surface 10c of the substrate. Thus, an excellent epitaxial crystal can hardly be obtained.

In FIGS. 2A-2C, while laser mark 12 is linearly formed to be parallel with arbitrarily specified crystal orientation 10a, laser mark 12 can be formed to form a certain angle between arbitrarily specified crystal orientation 10a. It can also be formed as dots, or a column of symbols and/or numbers.

Accordingly, with the GaN crystal substrate of the present embodiment, the front and rear surfaces are easily distinguishable from each other visually, and also the crystal orientation can easily be identified visually.

Here, referring to FIGS. 2A-2C, a method of forming laser mark 12 at rear surface 10r of GaN crystal substrate 10 is not specifically limited. When forming laser mark 12 at rear surface 10r of GaN crystal substrate 10 that is transparent to visible light (referring to light having a peak wavelength in a range of about 400 nm-800 nm), it may be carried out by emitting a light beam having a peak wavelength of at most 400 nm or a light beam having a peak wavelength of at least 5000 nm on rear surface 10r of GaN crystal substrate 10 to form a groove-like concave portion at rear surface 10r.

Third Embodiment

Referring to FIGS. 3A-3C and 4A-4C, still another embodiment of a GaN crystal substrate according to the present invention includes a matrix crystal region 11 and a differently oriented crystal region 13, which includes a crystal being different from a crystal of matrix crystal region 11 in at least one crystal axis. Differently oriented crystal region 13 is formed to have a shape indicative of arbitrarily specified crystal orientation 10a.

Since differently oriented crystal region 13 includes a crystal being different from a crystal of matrix crystal region 11 in at least one crystal axis, differently oriented crystal region 13 and matrix crystal region 11 are different from each other in lightness/darkness due to a difference in light absorption amount. This enables differently oriented crystal region 13 and matrix crystal region 11 to be distinguished from each other visually. Furthermore, since differently oriented crystal region 13 is formed to have a shape indicative of arbitrarily specified crystal orientation 10a of GaN crystal substrate 10, arbitrarily specified crystal orientation 10a of GaN crystal substrate 10 can be identified.

Here, referring to FIGS. 3A-3C and 4A-4C, a method of forming differently oriented crystal region 13 to have a shape indicative of an arbitrarily specified crystal orientation 10a of GaN crystal substrate 10 is not specifically limited. When arbitrarily specified crystal orientation 10a of GaN crystal substrate 10 is orientation <1-100> or <11-20>, for example by forming differently oriented crystal region 13 appearing on crystal growth surface 10c and rear surface 10r of GaN crystal substrate 10 to have a linear shape or a dashed line shape in parallel with orientation <1-100> or <11-20>, crystal orientation <1-100> or <11-20> can be identified.

Figure 3A:
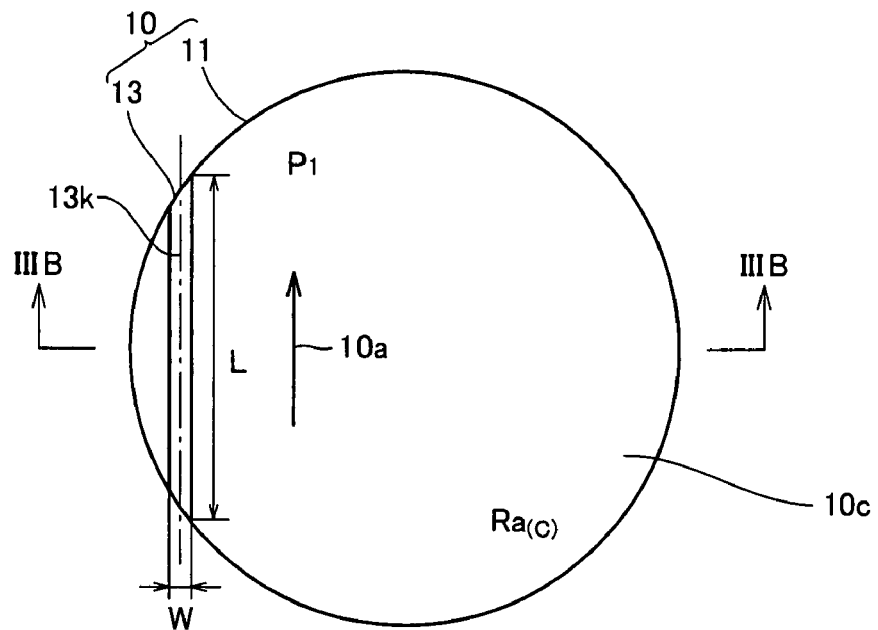
FIG. 3A is a schematic top view showing still another embodiment of a GaN crystal substrate according to the present invention.
Figure 3B:
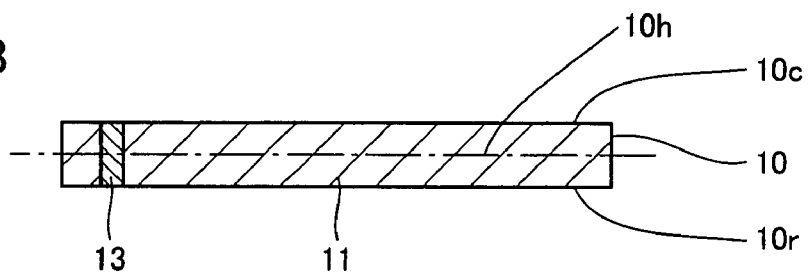
FIG. 3B is a schematic cross-sectional view along IIIB in FIGS. 3A and 3C.
Figure 3C:
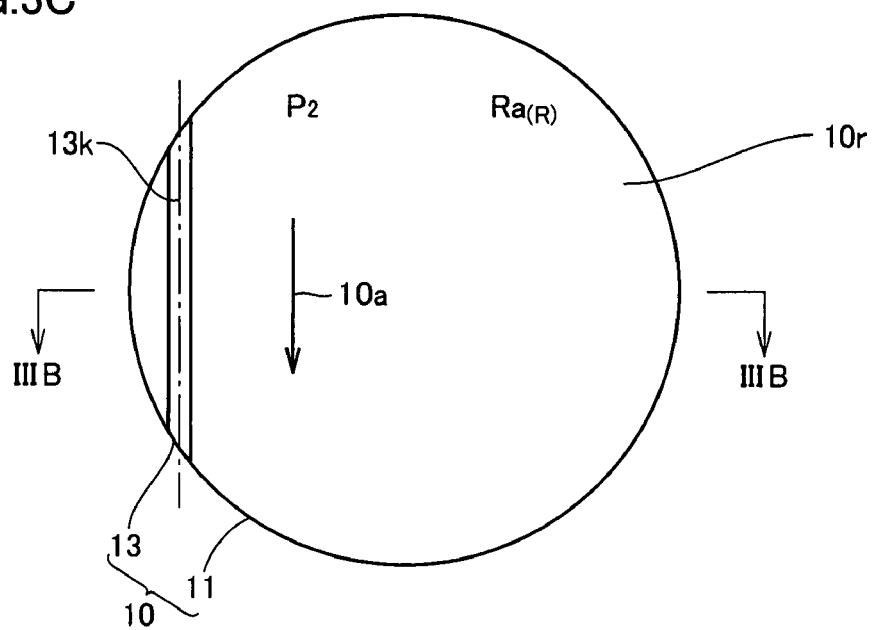
FIG. 3C is a schematic bottom view corresponding to FIG. 3A.

In FIGS. 3A-3C, while differently oriented crystal region 13 is formed to have a linear shape being parallel with arbitrarily specified crystal orientation 10a, differently oriented crystal region 13 can be formed to form a certain angle between arbitrarily specified crystal orientation 10a. It can also be formed as dots, or a column of symbols.

Figure 4A:
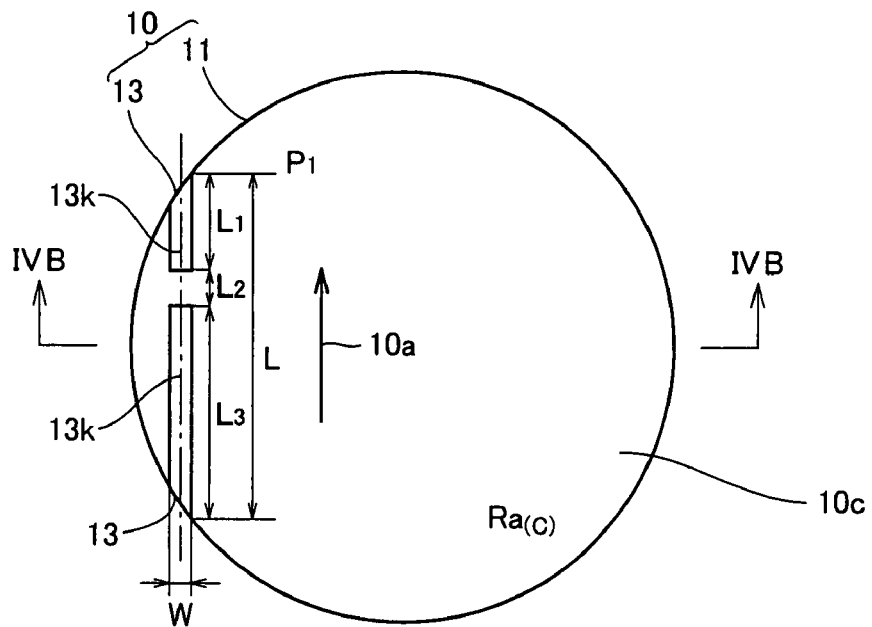
FIG. 4A is a schematic top view showing still another embodiment of a GaN crystal substrate according to the present invention.
Figure 4B:
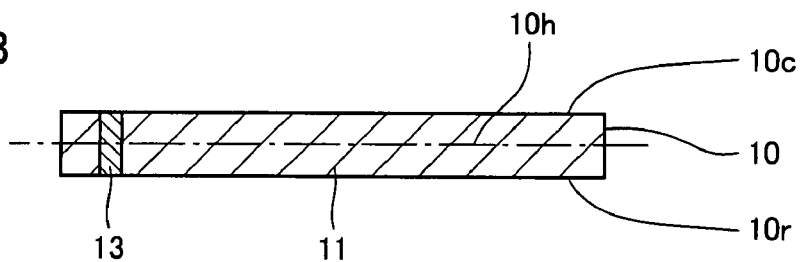
FIG. 4B is a schematic cross-sectional view along IVB in FIGS. 4A and 4C.
Figure 4C:
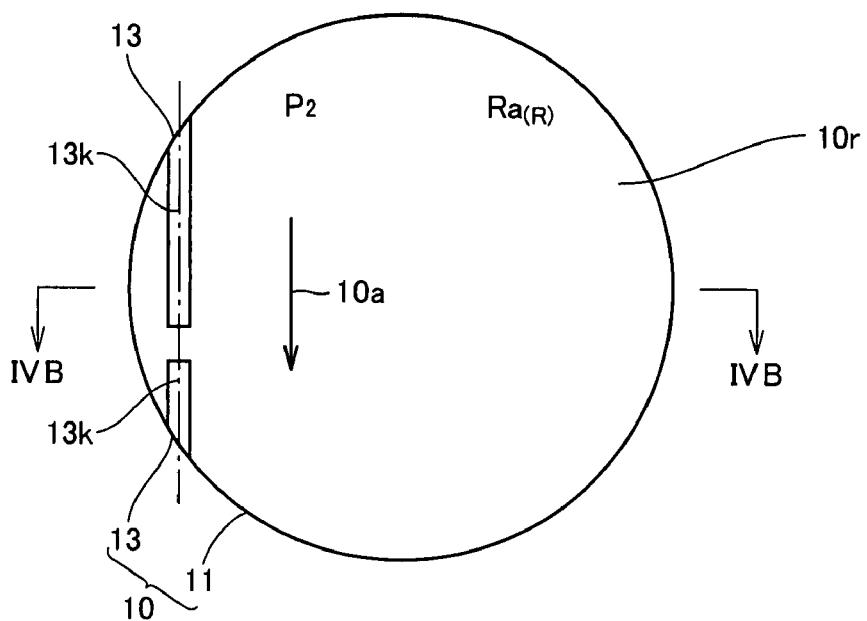
FIG. 4C is a schematic bottom view corresponding to FIG. 4A.

In the present embodiment, as shown in FIGS. 3A-3C and 4A-4C, differently oriented crystal region 13 penetrates GaN crystal substrate 10 in the thickness direction. Here, as shown in FIGS. 3A-3C, first and second patterns $P_1$ and $P_2$ of differently oriented crystal region 13 appearing on crystal growth surface 10c and rear surface 10r, respectively, may be identical to each other in relation to the outer shape of the substrate. Alternatively, as shown in FIGS. 4A-4C, first and second patterns $P_1$ and $P_2$ of differently oriented crystal region 13 appearing on crystal growth surface 10c and rear surface 10r, respectively, may be different from each other in relation to the outer shape of the substrate.

Here, specifically, an example of the patterns of differently oriented crystal region 13 shown in FIGS. 3A-3C is as follows. First and second patterns $P_1$ and $P_2$ are mirror symmetric relative to a plane 10h equally dividing the substrate in the thickness direction. Furthermore, first and second patterns $P_1$ and $P_2$ include differently oriented crystal regions 13 appearing at positions displaced from the center (not shown) of the crystal growth surface and rear surface of the substrate, respectively. Here, a center line 13k in the longitudinal direction of differently oriented crystal region 13 is on a straight line and being parallel with arbitrarily specified crystal orientation 10a.

An example of the patterns of differently oriented crystal region 13 shown in FIGS. 4A-4C is as follows. First and second patterns $P_1$ and $P_2$ are mirror symmetric relative to plane 10h equally dividing the substrate in the thickness direction. Furthermore, first and second patterns $P_1$ and $P_2$ each include two differently oriented crystal regions 13 appearing at positions displaced from the center (not shown) of the crystal growth surface and rear surface of the substrate, respectively. Here, lengths $L_1$ and $L_3$ in the longitudinal direction of each differently oriented crystal region 13 are different from each other. Center line 13k in the longitudinal direction of each differently oriented crystal region 13 is on a straight line and being parallel with arbitrarily specified crystal orientation 10a.

Here, referring to FIGS. 3A-3C and 4A-4C, while width W and length L of differently oriented crystal region 13 is not specifically limited, it is preferable that width W is at least 10 μm and at most 1000 μm, while length L is at least 5 mm and at most 20 mm. If width W is smaller than 10 μm, differently oriented crystal region 13 may disappear as a GaN crystal grows. If width W is greater than 1000 μm matrix crystal region 11 becomes small. If length L is smaller than 5 mm, a crystal orientation may hardly be identified, and differently oriented crystal region 13 may disappear as a GaN crystal grows. When length L is greater than 20 mm, matrix crystal region 11 becomes small. While in FIGS. 3A-3C and 4A-4C one differently oriented crystal region 13 having a linear shape or a dashed line shape is formed, considering the disappearance of differently oriented crystal region 13 along the growth of a GaN crystal, it is preferable that a plurality of (for example a plurality of lines of, or a plurality of dashed lines of) differently oriented crystal regions 13 are formed.

Furthermore, referring to FIGS. 3A-3C and 4A-4C, in GaN crystal substrate 10 of the present embodiment, similarly to the GaN crystal substrate of the first embodiment, it is preferable that roughness $Ra_{(C)}$ of crystal growth surface 10c is at most 10 nm while roughness $Ra_{(R)}$ of a rear surface 10r opposite to crystal growth surface 10c is at least 0.5 μm and at most 10 μm, and a ratio $Ra_{(R)}/Ra_{(C)}$ of surface roughness $Ra_{(R)}$ to surface roughness $Ra_{(C)}$ is at least 50. By the ratio $Ra_{(R)}/Ra_{(C)}$ being at least 50, the front and rear surfaces of the substrate are easily distinguishable from each other visually.

Fourth Embodiment

Referring to FIGS. 4A-4C, 5A-5C, 6A-6C, 7A-7D and 8A-8D, still another embodiment of a GaN crystal substrate according to the present invention includes, similarly to the third embodiment, a matrix crystal region 11 and a differently oriented crystal region 13, which includes a crystal being different from a crystal of matrix crystal region 11 in at least one crystal axis. Differently oriented crystal region 13 is formed to have a shape indicative of arbitrarily specified crystal orientation 10a. Furthermore, in GaN crystal substrate 10 of the present embodiment, differently oriented crystal region 13 penetrates the substrate in the thickness direction. First and second patterns $P_1$ and $P_2$ of differently oriented crystal region 13 appearing on crystal growth surface 10c and rear surface 10r of the substrate, respectively, are different from each other in relation to the outer shape of the substrate.

In GaN crystal substrate 10 of the present embodiment, differently oriented crystal region 13 is formed to have a shape indicative of arbitrarily specified crystal orientation 10a, and first and second patterns $P_1$ and $P_2$ of differently oriented crystal region 13 appearing on crystal growth surface 10c and rear surface 10r of the substrate, respectively, are different from each other in relation to the outer shape of the substrate. Therefore, irrespective of the magnitude of ratio $Ra_{(R)}/Ra_{(C)}$ of surface roughness $Ra_{(R)}$ of rear surface 10r to surface roughness $Ra_{(C)}$ of crystal growth surface 10c, for example even when ratio $Ra_{(R)}/Ra_{(C)}$ is smaller than 50, the crystal orientation of the substrate can be identified and front and rear surfaces thereof are distinguishable from each other.

In GaN crystal substrate 10 of the present embodiment, "first and second patterns $P_1$ and $P_2$ of differently oriented crystal region 13 appearing on crystal growth surface 10c and rear surface 10r, respectively, are different from each other in relation to the outer shape of the substrate" means that first and second patterns $P_1$ and $P_2$ are different from each other in the positional relationship in relation to the outer shape of the substrate. An example is shown in the following.

Referring to FIGS. 4A-4C, an example of the patterns of differently oriented crystal region 13 of the present embodiment is as follows. First and second patterns $P_1$ and $P_2$ are mirror symmetric relative to plane 10h equally dividing the substrate in the thickness direction. Furthermore, first and second patterns $P_1$ and $P_2$ each include two differently oriented crystal regions 13 appearing at positions displaced from the center (not shown) of the crystal growth surface and rear surface of the substrate, respectively. Here, lengths $L_1$ and $L_3$ in the longitudinal direction of each differently oriented crystal region 13 are different from each other. Center line 13k in the longitudinal direction of each differently oriented crystal region 13 is on one straight line and being parallel with arbitrarily specified crystal orientation 10a.

Figure 5A:
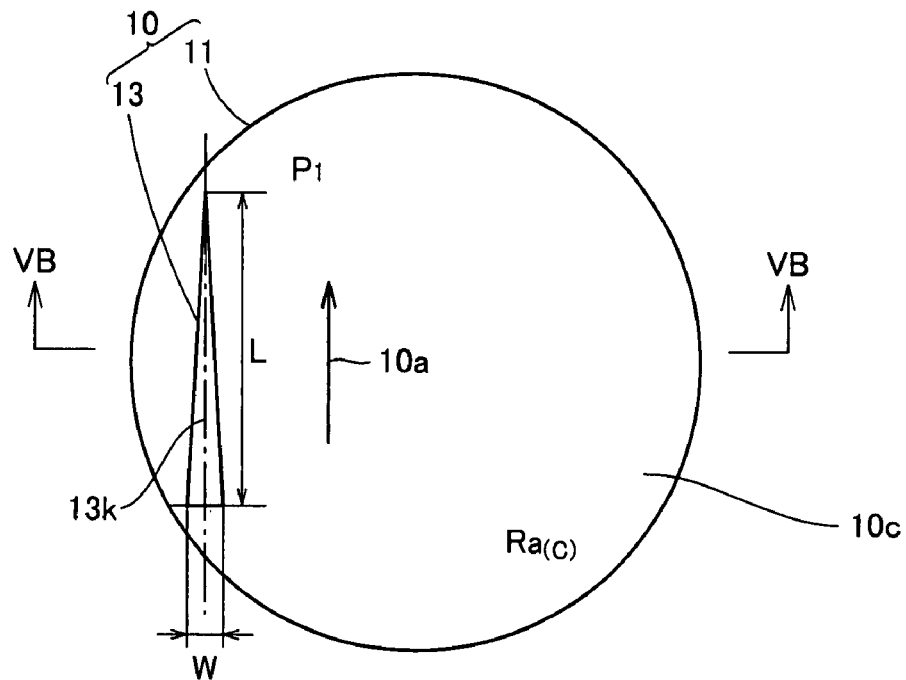
FIG. 5A is a schematic top view showing still another embodiment of a GaN crystal substrate according to the present invention.
Figure 5B:
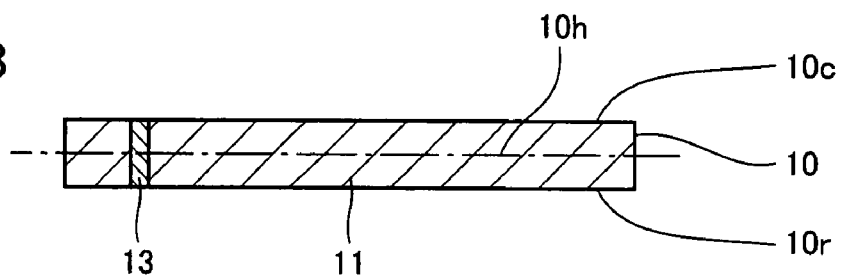
FIG. 5B is a schematic cross-sectional view along VB in FIGS. 5A and 5C.
Figure 5C:
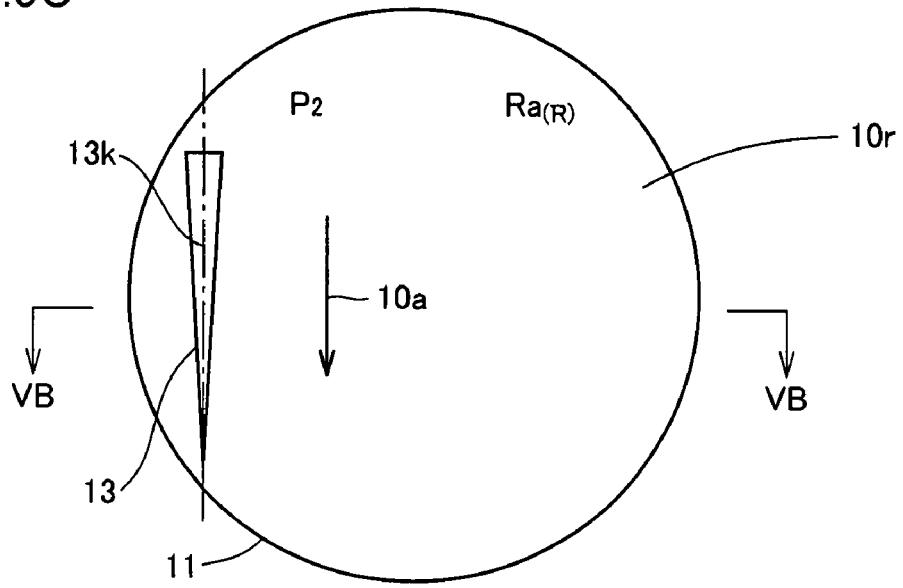
FIG. 5C is a schematic bottom view corresponding to FIG. 5A.

Referring to FIGS. 5A-5C, another example of the patterns of differently oriented crystal region 13 of the present embodiment is as follows. First and second patterns $P_1$ and $P_2$ are mirror symmetric relative to plane 10h equally dividing the substrate in the thickness direction. Furthermore, first and second patterns $P_1$ and $P_2$ include differently oriented crystal regions 13 being two-dimensionally triangular as appearing at positions displaced from the center (not shown) of the crystal growth surface and that of the rear surface of the substrate, respectively. Here, center line 13k in the longitudinal direction of differently oriented crystal region 13 is parallel with arbitrarily specified crystal orientation 10a.

Figure 6A:
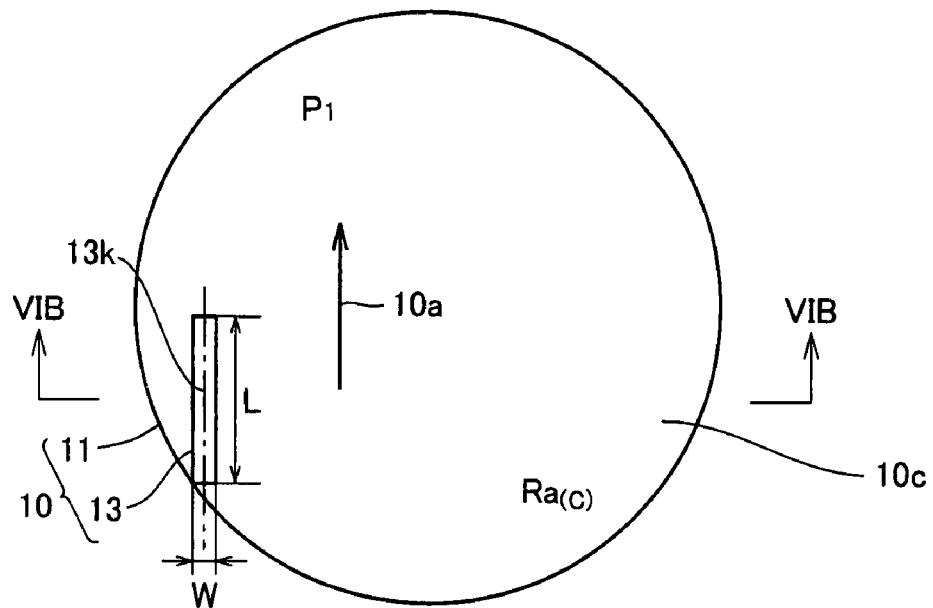
FIG. 6A is a schematic top view showing still another embodiment of a GaN crystal substrate according to the present invention.
Figure 6B:
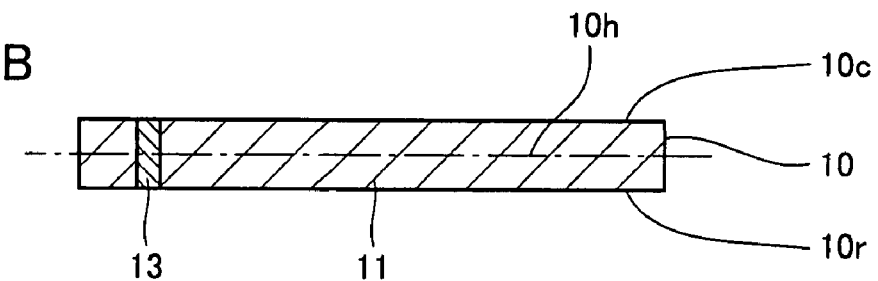
FIG. 6B is a schematic cross-sectional view along VIB in FIGS. 6A and 6C.
Figure 6C:
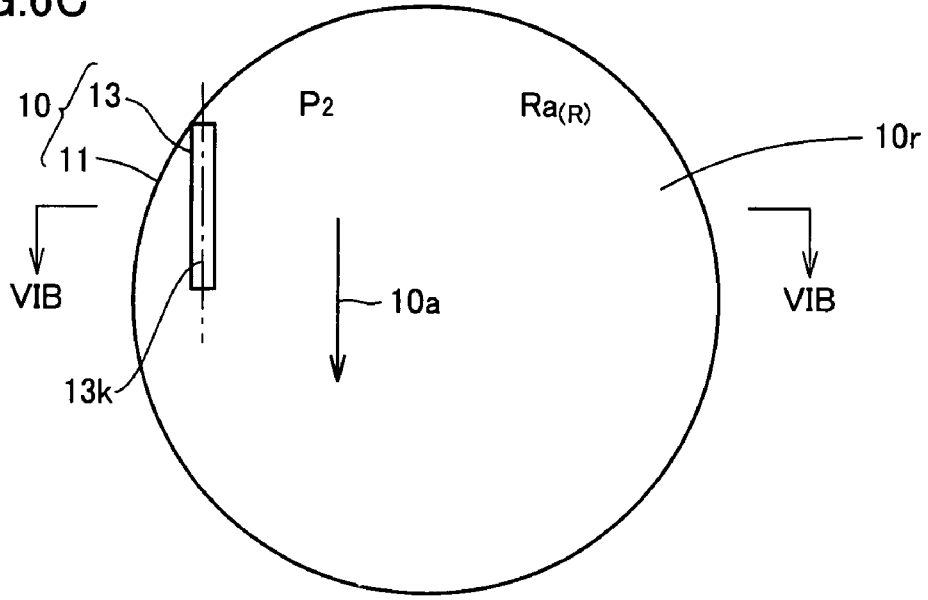
FIG. 6C is a schematic bottom view corresponding to FIG. 6A.

Referring to FIGS. 6A-6C, still another example of the patterns of differently oriented crystal region 13 of the present embodiment is as follows. First and second patterns $P_1$ and $P_2$ are mirror symmetric relative to plane 10h equally dividing the substrate in the thickness direction. Furthermore, first and second patterns $P_1$ and $P_2$ include differently oriented crystal region 13 being two-dimensionally quadrangular as appearing at positions displaced from the center (not shown) of the crystal growth surface and that of the rear surface of the substrate, respectively. Here, differently oriented crystal region 13 being two-dimensionally quadrangular has its one end only in contact with the periphery of the substrate. Center line 13k in the longitudinal direction of differently oriented crystal region 13 is parallel with arbitrarily specified crystal orientation 10a.

Referring to FIGS. 7A-7D, still another example of the patterns of differently oriented crystal region 13 of the present embodiment is as follows. First and second patterns $P_1$ and $P_2$ are mirror symmetric relative to plane 10h equally dividing the substrate in the thickness direction. Furthermore, first and second patterns $P_1$ and $P_2$ each include two differently oriented crystal regions 13 being two-dimensionally polygonal as appearing at positions displaced from the center (not shown) of the crystal growth surface and that of the rear surface of the substrate, respectively. Here, widths $W_1$ and $W_2$ of respective differently oriented crystal regions 13 are different from each other. Center line 13k passing through the center of each differently oriented crystal region 13 is parallel with arbitrarily specified crystal orientation 10a.

Referring to FIGS. 8A-8D, still another example of the patterns of differently oriented crystal region 13 of the present embodiment is as follows. First and second patterns $P_1$ and $P_2$ are mirror symmetric relative to a plane 10h equally dividing the substrate in the thickness direction. Furthermore, first and second patterns $P_1$ and $P_2$ each include two differently oriented crystal regions 13 each being two-dimensionally round as appearing at positions displaced from the center (not shown) of the crystal growth surface and that of the rear surface of the substrate, respectively. Here, diameters $W_1$ and $W_2$ of respective differently oriented crystal regions 13 are different from each other. Center line 13k passing through the center of each differently oriented crystal region 13 is parallel with arbitrarily specified crystal orientation 10a. It is noted that the term round includes circular and elliptical. It is noted that the diameter of an elliptic region refers to minor axis or major axis of the ellipse.

Fifth Embodiment

Referring to FIGS. 3A-3C, 4A-4C, 5A-5C, 6A-6C, 7A-7D, 8A-8D, and 9A, in GaN crystal substrate 10 of the third or fourth embodiment, preferably differently oriented crystal region 13 is a c-axis reversed crystal region 13t that is formed by a crystal that is identical to a crystal of matrix crystal region 11 in a-axis orientation and that is reverse to the same in c-axis orientation.

Here, "identical in a-axis orientation" means that a-axis of at least one crystal included in c-axis reversed crystal region 13t and a-axis of the crystal included in matrix crystal region 11 have substantially identically oriented directional vectors, with the displacement angle between respective a-axes being less than 30°. Here, "the displacement angle between the axes" refers to a solid angle formed between certain crystal axes (such as a-axis, c-axis or the like) of the two crystals, which can be measured by XRD (X-ray diffraction) and EBSP (Electron Back Scattering Pattern).

"Reverse in c-axis orientation" means that c-axis of at least one crystal included in c-axis reversed crystal region 13t has a directional vector that is substantially opposite to a directional vector of c-axis of a crystal included in matrix crystal region 11. Here, "having a directional vector that is substantially opposite" means that a displacement angle between c-axis of at least one crystal included in c-axis reversed crystal region 13t and c-axis of a crystal included in matrix crystal region 11 is less than 30° and their directional vectors are opposite to each other.

Matrix crystal region 11 and c-axis reversed crystal region 13t of GaN crystal substrate 10 can be observed using a fluorescent microscope. The crystal axis in each crystal region can be determined by XRD. C-axis reversed crystal region 13t and matrix crystal region 11 can easily be distinguished from each other by, besides the use of a fluorescent microscope, the difference in polarity by the convergent beam electron diffraction, the difference in the processing rate (meaning polishing rate and etching rate, hereinafter the same applies) of the main surface (meaning crystal growth surface 10c and rear surface 10r, hereinafter the same applies).

Figure 9A:
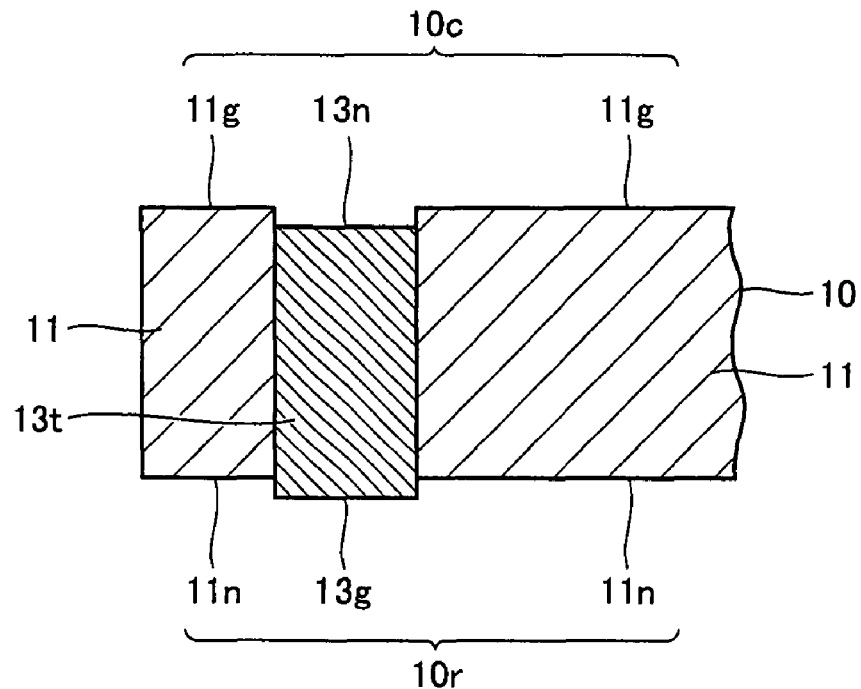
FIG. 9A is a schematic enlarged cross-sectional view where a differently oriented crystal region is a c-axis reversed crystal region.

When differently oriented crystal region 13 is c-axis reversed crystal region 13t, referring to FIG. 9A, a Ga atom surface 11g of matrix crystal region 11 and an N atom surface 13n of c-axis reversed crystal region 13t appear on crystal growth surface 10c of GaN crystal substrate 10, and an N atom surface 11n of matrix crystal region 11 and a Ga atom surface 13g of c-axis reversed crystal region 13t appear on rear surface 10r of GaN crystal substrate 10.

Here, since the N atom surface is greater than the Ga atom surface in the processing rate in a GaN crystal, when the main surface (crystal growth surface 10c and rear surface 10r) of GaN crystal substrate 10 is processed by polishing or etching, as shown in FIG. 9A, on crystal growth surface 10c side, N atom surface 13n of c-axis reversed crystal region 13t forms a concave portion relative to Ga atom surface 11g of matrix crystal region 11. On rear surface 10r side, Ga atom surface 13g of c-axis reversed crystal region 13t forms a convex portion relative to N atom surface 11n of matrix crystal region 11.

As above, on the main surface of GaN crystal substrate 10 having processed through polishing or the like, a level difference is generated at the bordering portion between c-axis reversed crystal region 13t and matrix crystal region 11, which enables easier visual identification of the position and shape of c-axis reversed crystal region 13t. The level difference is about 0.1 μm-2 μm, although it may vary depending on the processing conditions of the main surface.

Figure 10:
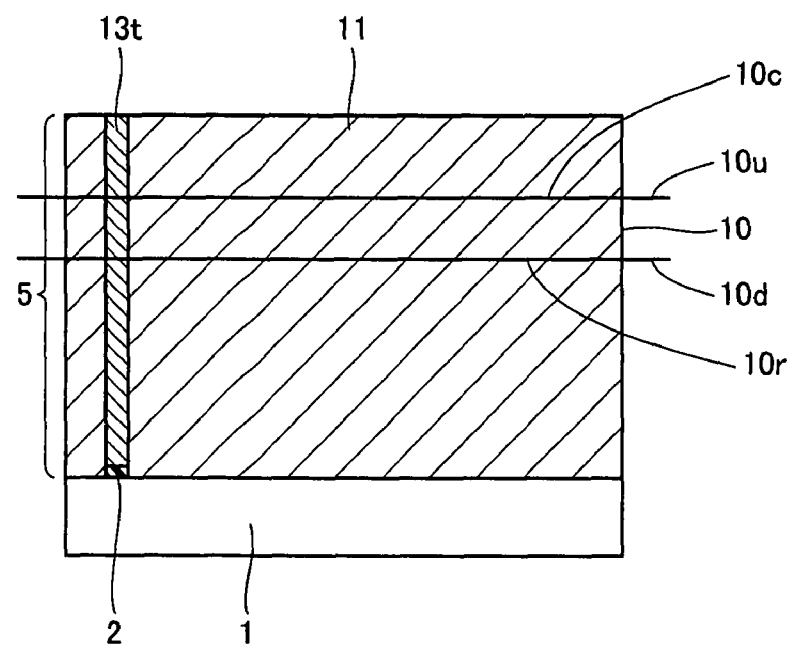
FIG. 10 is a schematic cross-sectional view showing one embodiment of a manufacturing method of a GaN crystal substrate including as a part thereof a c-axis reversed crystal region as a differently oriented crystal region.

Referring to FIG. 10, while a manufacturing method of GaN crystal substrate 10 including in its part c-axis reversed crystal region 13t as a differently oriented crystal region is specifically limited, it may be carried out as follows, for example. First, on a ground substrate 1, a mask layer 2 patterned to have a prescribed shape (for example a line having width W and length L) is formed. Here, ground substrate 1 is not specifically limited so long as it is capable of epitaxially growing GaN crystals. A sapphire substrate, a GaAs substrate, an SiC substrate and the like are preferably used. Mask layer 2 is not specifically limited so long as it is capable of suppressing the growth of GaN crystals. For example, an insulating layers such as an amorphous $SiO_2$ layer, an amorphous $Si_3N_4$ layer, a metal layer such as a Ti layer, an Ni layer, a W layer or the like is preferably used. Such mask layer 2 is formed by sputtering, CVD (Chemical Vapor Deposition) or the like. Patterning of mask layer 2 is carried out by photolithography or the like.

Next, on ground substrate 1 where mask layer 2 being patterned into a prescribed shape (of a line having width W and length L, for example) is formed, GaN crystal 5 is grown. Matrix crystal region 11 is formed on ground substrate 1, and c-axis reversed crystal region 13t patterned into a prescribed shape (of a line having width W and length L, for example) is formed on mask layer 2. Here, a method of growing GaN crystals is not specifically limited so long as it enables epitaxial growth, and HVPE (Hydride Vapor Phase Epitaxy), MOCVD (Metal Organic Vapor Phase Epitaxy) or the like is preferably used. Here, in the light of fast growth rate of GaN crystals, HVPE is preferably used.

Next, GaN crystal 5 obtained as above was sliced at surfaces 10u and 10d being parallel with the main surface of ground substrate 1. The main surface is processed by polishing and/or etching to obtain GaN crystal substrate 10.

Sixth Embodiment

Referring to FIGS. 3A-3C, 4A-4C, 5A-5C, 6A-6C, 7A-7D, 8A-8D, and 9B, in GaN crystal substrate 10 of the third or fourth embodiment, preferably differently oriented crystal region 13 is a polycrystal region 13m that includes a plurality of crystals that are different from a crystal of matrix crystal region 11 in a-axis orientation and that are identical to the same in c-axis orientation.

Here, "different in a-axis orientation" means that a-axis of a plurality of crystals included in polycrystal region 13m and a-axis of the crystal included in matrix crystal region 11 have substantially differently oriented directional vectors, with the displacement angle between respective a-axes being at most 60°. Here, a-axis orientations of a plurality of crystals included in polycrystal region 13m are randomly distributed in a range of displacement angles of at most 60° with respect to the a-axis orientation of the crystal included in matrix crystal region 11.

Here, "the crystals in polycrystal region 13m are identical to the crystal of matrix crystal region 11 in c-axis orientation" means that c-axis of a plurality of crystals included in polycrystal region 13m and c-axis of the crystal included in matrix crystal region 11 have substantially identically oriented directional vectors, with the displacement angle between respective c-axes being less than 30°.

Matrix crystal region 11 and polycrystal region 13m of GaN crystal substrate 10 can be observed using a fluorescent microscope. The crystal axis in each crystal region can be determined by XRD (X-ray diffraction). Polycrystal region 13m and matrix crystal region 11 can easily be distinguished from each other by, besides the use of fluorescent microscope, XRD, the difference in the processing rate of the main surface and the like.

Figure 9B:
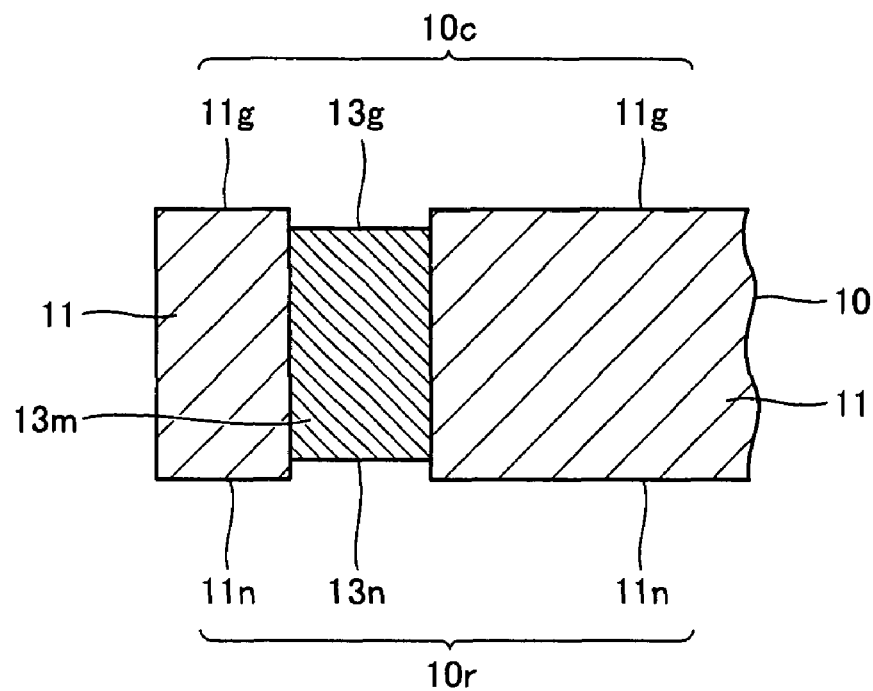
FIG. 9B is a schematic enlarged cross-sectional view where a differently oriented crystal region is a polycrystal region.

When differently oriented crystal region 13 is polycrystal region 13m, referring to FIG. 9B, since polycrystal region 13m is greater than monocrystalline matrix crystal region 11 in the processing rate (polishing rate and etching rate) of the main surface (crystal growth surface 10c and rear surface 10r), when the main surface of GaN crystal substrate 10 is processed by polishing or the like, as shown in FIG. 9B, on crystal growth surface 10c side, Ga atom surface 13g of polycrystal region 13m forms a concave portion with respect to Ga atom surface 11g of matrix crystal region 11. On rear surface 10r side also, N atom surface 13n of polycrystal region 13m forms a concave portion with respect to N atom surface 11n of matrix crystal region 11.

As above, on the main surface of GaN crystal substrate 10 having processed through polishing, etching or the like, a level difference is generated at the bordering portion between polycrystal region 13m and matrix crystal region 11, which enables easier visual identification of the position and shape of polycrystal region 13m. The level difference is about 0.1 μm-2 μm, although it may vary depending on the processing conditions of the main surface.

Figure 11:
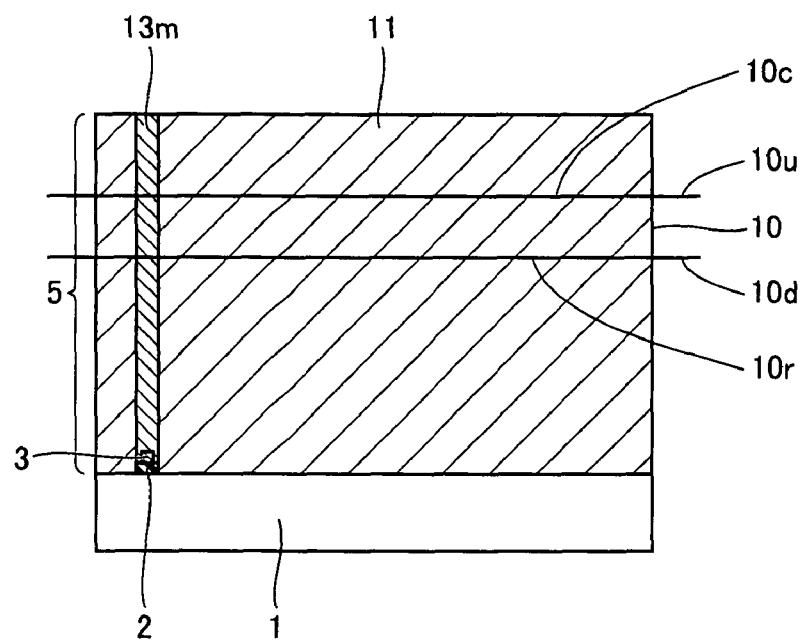
FIG. 11 is a schematic cross-sectional view showing one embodiment of a manufacturing method of a GaN crystal substrate including as a part thereof a polycrystal region as a differently oriented crystal region.

Referring to FIG. 11, while a manufacturing method of GaN crystal substrate 10 including in its part polycrystal region 13m as a differently oriented crystal region is specifically limited, it may be carried out as follows, for example. First, on a ground substrate 1, a mask layer 2 patterned to have a prescribed shape (for example a line having width W and length L) is formed. Here, ground substrate 1 is not specifically limited so long as it is capable of epitaxially growing GaN crystals. A sapphire substrate, a GaAs substrate, an SiC substrate and the like are preferably used. Mask layer 2 is not specifically limited so long as it is capable of suppressing the growth of GaN crystals, and so long as mask layer 2 has a characteristic that core crystal 3 is formed on mask layer 2 so that a-axis orientation of core crystal 3 is different from a-axis orientation of the crystal of the matrix crystal region. An amorphous $SiO_2$ layer, an amorphous $Si_3N_4$ layer or the like is preferably used. Such mask layer 2 is formed by sputtering, CVD (Chemical Vapor Deposition) or the like. Patterning of mask layer 2 is carried out by photolithography or the like.

Next, on ground substrate 1 where mask layer 2 being patterned into a prescribed shape (of a line having width W and length L, for example) is formed, GaN crystal 5 is grown. Here, setting the growth conditions of the GaN crystal where GaN gas attains supersaturation (for example, when the GaN crystal is grown through HVPE, conditions that partial pressure of Ga material gas is greater than 2.5 kPa and partial pressure of N material gas is greater than 30 kPa for at least three minutes from the start of GaN crystal growth), a plurality of core crystals 3 of GaN are formed on mask layer 2. From each of core crystals 3, a crystal having a-axis differently oriented from a-axis orientation of the crystal in the matrix crystal region grows to form polycrystal region 13m.

Next, GaN crystal 5 obtained as above was sliced at surfaces 10u and 10d being parallel with the main surface of ground substrate 1. The crystal growth surface and/or rear surface are/is processed by polishing and/or etching to obtain GaN crystal substrate 10.

Surface roughness measurement in the present invention was carried out by using a measurement apparatus employing optical interferometry for a surface having small surface roughness, and by using a 3D-SEM for a surface having great surface roughness, both in a range of 100 μm×100 μm square as a reference area.

EXAMPLE 1

By HVPE, under the conditions that partial pressure of GaCl gas being Ga material gas was 2.5 kPa and partial pressure of $NH_3$ gas being N material gas was 15 kPa, GaN crystal having a diameter of 50.8 mm and a thickness of 3 mm was grown on a sapphire substrate, which was a ground substrate having a diameter of 50.8 mm and a thickness of 350 μm. The GaN crystal was sliced in parallel with the main surface of the ground substrate to produce GaN crystal substrate 10 having a diameter of 50 mm and a thickness of 400 μm as shown in FIGS. 1A-1C.

Rear surface 10r and crystal growth surface 10c of obtained GaN crystal substrate 10 were processed as described below. The rear surface was subjected to grinding using fixed abrasive grains made by fixing SiC abrasive grains having a grain size of 40 μm with a bond (the grinding step). The crystal growth surface was subjected to grinding using fixed abrasive grains made by fixing SiC abrasive grains having a grain size of 40 μm with a bond (the grinding step), polishing using SiC abrasive grains having a grain size of 6 μm (the coarse polishing step), and subsequently polishing using SiC abrasive grains having a grain size of 2 μm (the fine polishing step).

Thus, a GaN crystal substrate in which roughness $Ra_{(C)}$ of the crystal growth surface was 7 nm, roughness $Ra_{(R)}$ of the rear surface was 3 μm, and $Ra_{(R)}/Ra_{(C)}$ was about 430 was obtained. The gloss of the GaN crystal substrate was different between the crystal growth surface and the rear surface, and the front and rear surfaces were easily distinguishable from each other visually.

EXAMPLE 2

Referring to FIGS. 2A-2C, on rear surface 10r of GaN crystal substrate 10 obtained in Example 1, using $CO_2$ laser, a laser mark 12 was formed, which was a linear groove having a width W of 100 μm, a depth D of 25 μm, and a length L of 10 mm, in parallel with orientation <11-20> as arbitrarily specified crystal orientation 10a. With the GaN crystal substrate of the present example, the front and rear surfaces were visually distinguishable from each other, and the crystal orientation of GaN crystal substrate 10 could be identified visually by laser mark 12.

EXAMPLE 3

Referring to FIGS. 3A-3C and 10, on a sapphire substrate being a ground substrate 1 having a diameter of 50.8 mm and a thickness of 350 μm, by sputtering and photolithography, a quadrangular amorphous $SiO_2$ layer having a width W of 100 μm and a length L of 10 mm was formed as mask layer 2 patterned into the same shape as in FIG. 3A. Next, on the sapphire substrate (ground substrate 1) on which the amorphous $SiO_2$ layer (mask layer 2) patterned into the above-described shape was formed, by HVPE, under the conditions that partial pressure of GaCl gas being Ga material gas was 2.5 kPa and partial pressure of $NH_3$ gas being N material gas was 15 kPa, GaN crystal 5 having a diameter of 50.8 mm and a thickness of 3 mm was grown.

In GaN crystal 5, matrix crystal region 11 was grown on the sapphire substrate (ground substrate 1). On the amorphous SiO$_2$ layer (mask layer 2), c-axis reversed crystal region 13t was grown as differently oriented crystalline region 13, which appeared on the crystal surface in a quadrangular shape having a width W of 95 μm and a length L of 10 mm as shown in FIGS. 3A-3C and 10.

As in Example 1, obtained GaN crystal 5 was sliced in parallel with the main surface of ground substrate 1 to produce GaN crystal substrate 10 having a diameter of 50 mm and a thickness of 400 μm. In obtained GaN crystal substrate 10, differently oriented crystal region 13 penetrated GaN crystal substrate 10 in the thickness direction, and first and second patterns P$_1$ and P$_2$ of differently oriented crystal region 13 appearing on crystal growth surface 10c and rear surface 10r, respectively, were identical to each other in relation to the outer shape of GaN crystal substrate 10.

Here, since the crystal growth rate of differently oriented crystal region 13 (in the present example, c-axis reversed crystal region 13t) is generally smaller than that of matrix crystal region 11, width W of differently oriented crystal region 13 appearing on the crystal surface tends to gradually decrease as the growth thickness of the GaN crystal increases. However, with GaN crystal substrate 10 having a thickness of about 400 μm, the width of differently oriented crystal region 13 appearing on crystal growth surface 10c and the width of differently oriented crystal region 13 appearing on rear surface 10r are substantially the same. This holds true for other Examples.

The rear surface and crystal growth surface of the obtained GaN crystal substrate were subjected to the similar processes as in Example 1. Thus, a GaN crystal substrate in which roughness Ra$_{(C)}$ of the crystal growth surface was 7 nm, roughness Ra$_{(R)}$ of the rear surface was 3 μm, and Ra$_{(R)}$/Ra$_{(C)}$ was about 430 was obtained. The gloss of the GaN crystal substrate was different between crystal growth surface 10c and rear surface 10r, and the front and rear surfaces were easily distinguishable from each other visually.

With the GaN crystal substrate of the present example, the front and rear surfaces were visually distinguishable from each other, and the crystal orientation of GaN crystal substrate 10 could be identified visually by the shape of differently oriented crystal region 13 (c-axis reversed crystal region 13t).

EXAMPLE 4

Referring to FIGS. 4A-4C and 10, on a sapphire substrate being a ground substrate 1 having a diameter of 50.8 mm and a thickness of 350 μm, by sputtering and photolithography, quadrangular amorphous SiO$_2$ layers having a width W of 100 μm and a length L$_1$ of 4 mm and having a width W of 100 μm and a length L$_3$ of 9 mm, respectively, were formed as mask layers 2 patterned into the same shape as in FIG. 4A. Here, the two amorphous SiO$_2$ layers were formed to be separated by length L$_2$ of 2 mm in their longitudinal direction. Next, on the sapphire substrate (ground substrate 1) on which the amorphous SiO$_2$ layers (mask layers 2) patterned into the above-described shape were formed, by HVPE, under the conditions that partial pressure of GaCl gas being Ga material gas was 2.5 kPa and partial pressure of NH$_3$ gas being N material gas was 15 kPa, GaN crystal 5 having a diameter of 50.8 mm and a thickness of 3 mm was grown.

In GaN crystal 5, matrix crystal region 11 was grown on the sapphire substrate (ground substrate 1). On amorphous SiO$_2$ layers (mask layers 2), c-axis reversed crystal regions 13t were grown as differently oriented crystal regions 13, which appeared on the crystal surface in quadrangular shapes having a width W of 95 μm and a length L$_1$ of 4 mm and having a width W of 95 μm and a length L$_3$ of 9 mm, respectively, as shown in FIGS. 4A-4C and 10. Here, the two differently oriented crystal regions 13 (c-axis reversed crystal regions 13t) were separated by length L$_2$ of 2 mm in their longitudinal direction.

As in Example 1, obtained GaN crystal 5 was sliced in parallel with the main surface of ground substrate 1 to produce GaN crystal substrate 10 having a diameter of 50 mm and a thickness of 400 μm. In obtained GaN crystal substrate 10, differently oriented crystal regions 13 (c-axis reversed crystal regions 13t) penetrated in the thickness direction of GaN crystal substrate 10, and first and second patterns P$_1$ and P$_2$ of differently oriented crystal regions 13 appearing on crystal growth surface 10c and rear surface 10r, respectively, were different from each other in relation to the outer shape of the substrate.

The rear surface 10r and crystal growth surface 10c of the obtained GaN crystal substrate were subjected to the similar processes as in Example 1. Thus, a GaN crystal substrate in which roughness Ra$_{(C)}$ of the crystal growth surface was 1.5 nm, roughness Ra$_{(R)}$ of the rear surface was 3 μm, and Ra$_{(R)}$/Ra$_{(C)}$ was about 2000 was obtained. The gloss of the GaN crystal substrate was different between the crystal growth surface and the rear surface, and the front and rear surfaces were easily distinguishable from each other visually.

With the GaN crystal substrate of the present example, the front and rear surfaces were visually distinguishable from each other, and the crystal orientation of GaN crystal substrate 10 could be identified visually by the shape of differently oriented crystal region 13 (c-axis reversed crystal region 13t). In the present example, first and second patterns P$_1$ and P$_2$ of differently oriented crystal regions 13 appearing on crystal growth surface 10c and rear surface 10r, respectively, were different from each other in relation to the outer shape of GaN crystal substrate 10. Therefore, even when the front and rear surfaces are not distinguishable from each other visually by surface roughness Ra (roughness Ra$_{(C)}$ of crystal growth surface 10c and roughness Ra$_{(R)}$ of rear surface 10r), the front and rear surfaces of the substrate are distinguishable from each other and the crystal orientation can be identified.

EXAMPLE 5

GaN crystal 5 having a diameter of 50.8 mm and a thickness of 3 mm was grown similarly as in Example 3; except that the mask layer formed on the sapphire substrate was Ni layer and the conditions for growing the GaN crystal by HVPE were that partial pressure of GaCl gas being Ga material gas was 2.5 kPa and partial pressure of NH$_3$ gas being N material gas was 25 kPa.

In GaN crystal 5, matrix crystal region 11 was grown on the sapphire substrate (ground substrate 1). On amorphous SiO$_2$ layer (mask layer 2), polycrystal region 13m was grown as differently oriented crystal region 13, which appeared on the crystal surface in a quadrangular shape having a width W of 95 μm and a length L of 10 mm as shown in FIGS. 3A-3C and 11.

From obtained GaN crystal 5, similarly to Example 3, GaN crystal substrate 10 having a diameter of 50 mm and a thickness of 400 μm was prepared. Here, in obtained GaN crystal substrate 10, differently oriented crystal region 13 (polycrystal region 13m) penetrated in the thickness direction of GaN crystal substrate 10, and first and second patterns P$_1$ and P$_2$ of differently oriented crystal region 13 appearing on crystal growth surface 10c and rear surface 10r, respectively, were identical to each other in relation to the outer shape of the substrate.

Here, since the crystal growth rate of differently oriented crystal region 13 (in the present example, polycrystal region 13m) is generally smaller than that of matrix crystal region 11, width W of differently oriented crystal region 13 appearing on the crystal surface tends to gradually decrease as the growth thickness of the GaN crystal increases. However, with GaN crystal substrate 10 having a thickness of about 400 μm, the width of differently oriented crystal region 13 appearing on crystal growth surface 10c and the width of differently oriented crystal region 13 appearing on rear surface 10r are substantially the same. This holds true for other Examples.

With the GaN crystal substrate of the present example, the front and rear surfaces were visually distinguishable from each other, and the crystal orientation of GaN crystal substrate 10 could be identified visually by the shape of differently oriented crystal region 13 (polycrystal region 13m).

EXAMPLE 6

GaN crystal 5 having a diameter of 50.8 mm and a thickness of 3 mm was grown similarly as in Example 4, except that the conditions for growing the GaN crystal by HVPE were that partial pressure of GaCl gas being Ga material gas was 2.5 kPa and partial pressure of $NH_3$ gas being N material gas was 25 kPa.

In GaN crystal 5, matrix crystal region 11 was formed on the sapphire substrate (ground substrate 1). On amorphous $SiO_2$ layer (mask layer 2), polycrystal regions 13m were grown as differently oriented crystalline region 13, which appeared on the crystal surface in quadrangular shapes having a width W of 95 μm and a length $L_1$ of 4 mm and having a width W of 95 μm and a length $L_3$ of 9 mm, respectively as shown in FIGS. 4A-4C and 11. Here, the two differently oriented crystal regions 13 (polycrystal regions 13m) were separated by length $L_2$ of 2 mm in their longitudinal direction.

From obtained GaN crystal 5, similarly as in Fourth Embodiment, GaN crystal substrate 10 having a diameter of 50 mm and a thickness of 400 μm was produced. Here, in obtained GaN crystal substrate 10, differently oriented crystal regions 13 (polycrystal regions 13m) penetrated in the thickness direction of GaN crystal substrate 10, and first and second patterns $P_1$ and $P_2$ of differently oriented crystal regions 13 appearing on crystal growth surface 10c and rear surface 10r, respectively, were different from each other in relation to the outer shape of the substrate.

With the GaN crystal substrate of the present example, the front and rear surfaces were visually distinguishable from each other, and the crystal orientation of GaN crystal substrate 10 could be identified visually by the shape of differently oriented crystal regions 13 (polycrystal regions 13m). In the present example, first and second patterns $P_1$ and $P_2$ of differently oriented crystal regions 13 appearing on crystal growth surface 10c and rear surface 10r, respectively, were different from each other in relation to the outer shape of GaN crystal substrate 10. Therefore, even when the front and rear surfaces are not distinguishable from each other visually by surface roughness Ra (roughness $Ra_{(C)}$ of crystal growth surface 10c and roughness $Ra_{(R)}$ of rear surface 10r), the front and rear surfaces of the substrate becomes distinguishable from each other and the crystal orientation can be identified.

With GaN crystal substrate 10 in which the front and rear surfaces are not distinguishable from each other visually by surface roughness Ra (roughness $Ra_{(C)}$ of crystal growth surface 10c and roughness $Ra_{(R)}$ of rear surface 10r), the front and rear surfaces of the substrate becomes distinguishable from each other and the crystal orientation can be identified if differently oriented crystal regions 13 penetrate in the thickness direction of GaN crystal substrate 10 and first and second patterns $P_1$ and $P_2$ of differently oriented crystal regions 13 appearing on crystal growth surface 10c and rear surface 10r, respectively, are different from each other in relation to the outer shape of the substrate. This will be described based on the following examples.

When the rear surface is a nitrogen surface, besides the above-described grinding, unevenness can be formed on the surface utilizing the feature of the nitrogen surface being easily etched than the gallium surface. Here, it has been confirmed that the effect similar to the above can be attained by using NaOH, KOH or the like as the etchant.

EXAMPLE 7

Referring to FIGS. 3A-3C, 10 and 11, in GaN crystal substrate 10 sliced from GaN crystal 5 grown similarly as in Example 3 or Example 5 at surfaces 10u and 10d being parallel with the main surface of ground substrate 1, differently oriented crystal region 13 penetrated in the thickness direction of the substrate, and first and second patterns $P_1$ and $P_2$ of differently oriented crystal regions 13 appearing on crystal growth surface 10c and rear surface 10r, respectively, were identical to each other in relation to the outer shape of the substrate. Crystal growth surface 10c and rear surface 10r of GaN crystal substrate 10 were processed by grinding using fixed abrasive grains made by fixing SiC abrasive grains having a grain size of 40 μm with a bond (the grinding step), polishing using SiC abrasive grains having a grain size of 5 μm (the coarse polishing step), and polishing using $Al_2O_3$ abrasive grains having a grain size of 1 μm (the fine polishing step).

In GaN crystal substrate 10 obtained by processing crystal growth surface 10c and rear surface 10r, roughness $Ra_{(C)}$ of crystal growth surface 10c was 1.5 nm and roughness $Ra_{(R)}$ of rear surface 10r was 1.5 nm. Hence, the front and rear surfaces were not distinguishable from each other by surface roughness Ra. Additionally, in GaN crystal substrate 10, since first and second patterns $P_1$ and $P_2$ of differently oriented crystal region 13 appearing on crystal growth surface 10c and rear surface 10r, respectively, were identical to each other in relation to the outer shape of the substrate, the crystal orientation of the substrate could be identified by the shape of differently oriented crystal region 13, but the front and rear surfaces of the substrate were not distinguishable from each other.

EXAMPLE 8

Referring to FIGS. 4A-4C, 10 and 11, in GaN crystal substrate 10 sliced from GaN crystal 5 grown similarly as in Example 4 or Example 6 at surfaces 10u and 10d being parallel with the main surface of ground substrate 1, differently oriented crystal regions 13 penetrated in the thickness direction of the substrate, and first and second patterns $P_1$ and $P_2$ of differently oriented crystal regions 13 appearing on crystal growth surface 10c and rear surface 10r of the substrate, respectively, were different from each other in relation to the outer shape of the substrate. Crystal growth surface 10c and rear surface 10r of GaN crystal substrate 10 were processed similarly as in Example 7.

After the process, roughness $Ra_{(C)}$ of crystal growth surface 10c of GaN crystal substrate 10 was 1.5 nm and roughness $Ra_{(R)}$ of rear surface 10r was 1.5 nm. Hence, the front and rear surfaces were not distinguishable from each other by surface roughness Ra. However, with GaN crystal substrate 10, the crystal orientation could be identified by the shape of differently oriented crystal regions 13 and the front and rear surfaces of the substrate were distinguishable from each other, since first and second patterns $P_1$ and $P_2$ of differently oriented crystal regions 13 appearing on crystal growth surface 10c and rear surface 10r, respectively, were different from each other in relation to the outer shape of the substrate.

EXAMPLE 9

Referring to FIGS. 5A-5C and 10, on a sapphire substrate being ground substrate 1 having a diameter of 50.8 mm and a thickness of 350 µm, by sputtering and photolithography, an amorphous $SiO_2$ layer in an isosceles triangle shape having a base width W of 40 µm and a height L of 10 mm was formed as mask layer 2 patterned into the same shape as in FIG. 5A. Here, the amorphous $SiO_2$ layer was formed such that center line 13k in the longitudinal direction of the isosceles triangle is parallel with orientation <11-20> of the grown GaN crystal as arbitrarily specified crystal orientation 10a. Next, on the sapphire substrate (ground substrate 1) on which the amorphous $SiO_2$ layer (mask layer 2) patterned into the above-described shape was formed, by HVPE, under the conditions that partial pressure of GaCl gas being Ga material gas was 2.5 kPa and partial pressure of $NH_3$ gas being N material gas was 15 kPa, GaN crystal 5 having a diameter of 50.8 mm and a thickness of 3 mm was grown.

In GaN crystal 5, matrix crystal region 11 was grown on the sapphire substrate (ground substrate 1): On the amorphous $SiO_2$ layer (mask layer 2), c-axis reversed crystal region 13t was grown as differently oriented crystalline region 13, which appeared on the crystal surface in a shape of isosceles triangle having a base width W of 35 µm and a height L of 10 mm as shown in FIGS. 5A-5C and 10. Center line 13k in the longitudinal direction of differently oriented crystal region 13 (c-axis reversed crystal region 13t) was parallel with orientation <11-20>.

As in Example 1, obtained GaN crystal 5 was sliced in parallel with the main surface of ground substrate 1 to produce GaN crystal substrate 10 having a diameter of 50 mm and a thickness of 400 µm. In obtained GaN crystal substrate 10, differently oriented crystal region 13 penetrated in the thickness direction of GaN crystal substrate 10, and first and second patterns $P_1$ and $P_2$ of differently oriented crystal region 13 appearing on crystal growth surface 10c and rear surface 10r, respectively, were different from each other in relation to the outer shape of the substrate.

Here, since the crystal growth rate of differently oriented crystal region 13 (in the present example, c-axis reversed crystal region 13t) is generally smaller than that of matrix crystal region 11, width W of differently oriented crystal region 13 appearing on the crystal surface tends to gradually decrease as the growth thickness of the GaN crystal increases. However, with GaN crystal substrate 10 having a thickness of about 400 µm, the width of differently oriented crystal region 13 appearing on crystal growth surface 10c and the width of differently oriented crystal region 13 appearing on rear surface 10r are substantially the same. This holds true for other Examples.

The rear surface and crystal growth surface of the obtained GaN crystal substrate were subjected to the similar processes as in Example 7. In GaN crystal substrate 10 obtained by such processes, roughness $Ra_{(C)}$ of crystal growth surface 10c of GaN crystal substrate 10 was 1.7 nm and roughness $Ra_{(R)}$ of rear surface 10r was 1.8 nm. Hence, the front and rear surfaces were not distinguishable from each other by surface roughness Ra. However, with GaN crystal substrate 10, the crystal orientation could be identified by the shape of differently oriented crystal region 13, and the front and rear surfaces of the substrate were distinguishable from each other since first and second patterns $P_1$ and $P_2$ of differently oriented crystal region 13 appearing on crystal growth surface 10c and rear surface 10r, respectively, were different from each other in relation to the outer shape of the substrate.

EXAMPLE 10

Referring to FIGS. 6A-6C and 10, on a sapphire substrate being a ground substrate 1 having a diameter of 50.8 mm and a thickness of 350 µm, by sputtering and photolithography, a quadrangular amorphous $SiO_2$ layer having a width W of 30 µm and a length L of 5 mm was formed as mask layer 2 patterned into the same shape as in FIG. 6A. Here, the amorphous $SiO_2$ layer was formed such that center line 13k in the longitudinal direction of the quadrangle is parallel with orientation <1-100> of the grown GaN crystal as arbitrarily specified crystal orientation 10a. Next, on the sapphire substrate (ground substrate 1) on which the amorphous $SiO_2$ layer (mask layer 2) patterned into the above-described shape was formed, GaN crystal 5 having a diameter of 50.8 mm and a thickness of 3 mm was grown as in Example 9.

In GaN crystal 5, matrix crystal region 11 was grown on the sapphire substrate (ground substrate 1). On amorphous $SiO_2$ layer (mask layer 2), c-axis reversed crystal region 13t was grown as differently oriented crystalline region 13, which appeared on the crystal surface in a quadrangular shape having a width W of 25 µm and a length L of 5 mm as shown in FIGS. 6A-6C and 10. Center line 13k of differently oriented crystal region 13 (c-axis reversed crystal regions 13t) was parallel with orientation <1-100>.

As in Example 1, obtained GaN crystal 5 was sliced in parallel with the main surface of ground substrate 1 to produce GaN crystal substrate 10 having a diameter of 50 mm and a thickness of 400 µm. In obtained GaN crystal substrate 10, differently oriented crystal region 13 penetrated in the thickness direction of GaN crystal substrate 10, and first and second patterns $P_1$ and $P_2$ of differently oriented crystal regions 13 appearing on crystal growth surface 10c and rear surface 10r, respectively, were different from each other in relation to the outer shape of the substrate.

The rear surface 10r and crystal growth surface 10c of the obtained GaN crystal substrate were subjected to the similar processes as in Example 7. In the processed GaN crystal substrate, roughness $Ra_{(C)}$ of the crystal growth surface was 1.7 nm, roughness $Ra_{(R)}$ of the rear surface was 1.8 nm. Hence, the front and rear surfaces were not distinguishable from each other by surface roughness Ra. However, with GaN crystal substrate 10, the crystal orientation could be identified by the shape of differently oriented crystal regions 13 and the front and rear surfaces of the substrate were distinguishable from each other since first and second patterns $P_1$ and $P_2$ of differently oriented crystal region 13 appearing on crystal growth surface 10c and rear surface 10r, respectively, were different from each other in relation to the outer shape of the substrate.

EXAMPLE 11

Figure 7A:
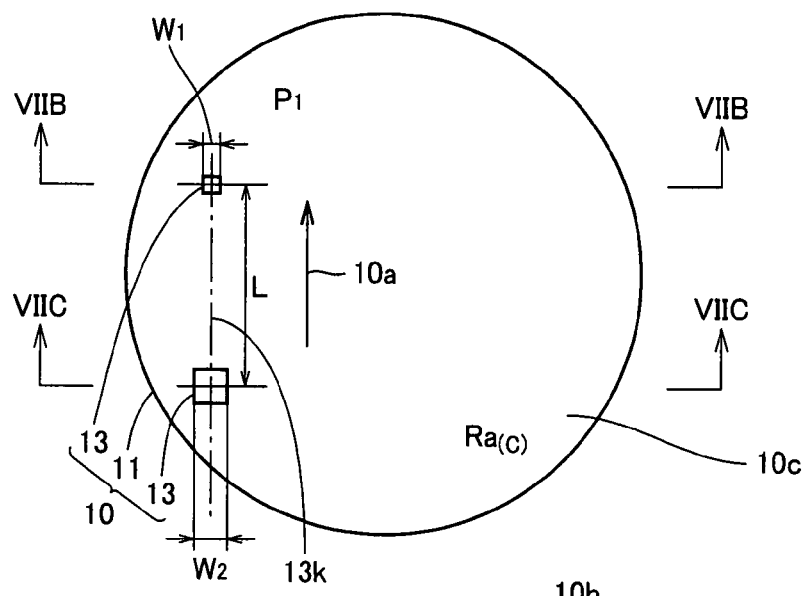
FIG. 7A is a schematic top view showing still another embodiment of a GaN crystal substrate according to the present invention.
Figure 7B:
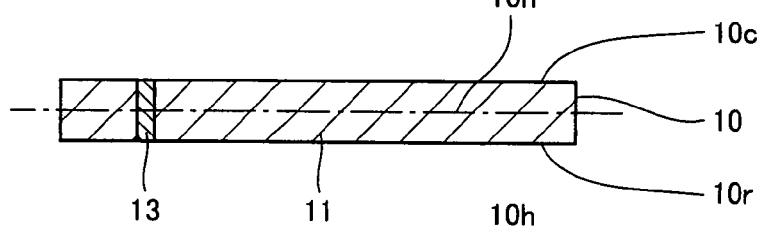
FIG. 7B is a schematic cross-sectional view along VIIB in FIGS. 7A and 7D.
Figure 7C:
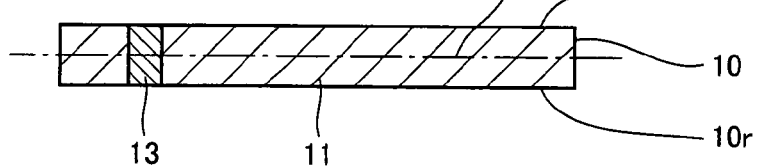
FIG. 7C is a schematic cross-sectional view along VIIC in FIGS. 7A and 7D.
Figure 7D:
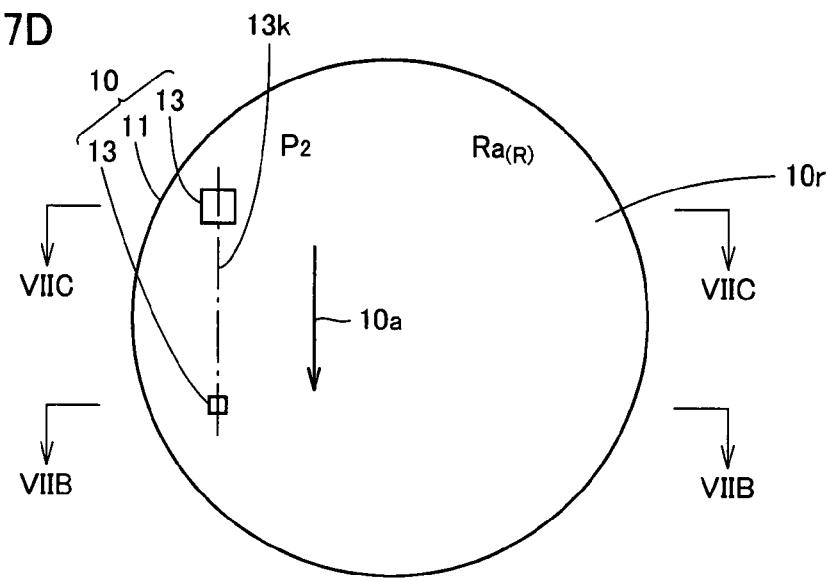
FIG. 7D is a schematic bottom view corresponding to FIG. 7A.

Referring to FIGS. 7A-7C and 10, on a sapphire substrate being ground substrate 1 having a diameter of 50.8 mm and a thickness of 350 µm, by sputtering and photolithography, a square amorphous $SiO_2$ layer having a width $W_1$ of 20 µm and a square amorphous SiO$_2$ layer having a width W$_2$ of 40 μm were formed as mask layers 2 patterned into the same shape as in, FIG. 7A. Here, a distance L between the centers of the two amorphous SiO$_2$ layers was 10 mm. The two amorphous SiO$_2$ layers were formed such that center line 13k passing through the center of two amorphous SiO$_2$ layers was in parallel with orientation <1-100> of the grown GaN crystal as arbitrarily specified crystal orientation 10a. Next, on the sapphire substrate (ground substrate 1) on which the amorphous SiO$_2$ layers (mask layers 2) patterned into the above-described shape were formed, GaN crystal 5 having a diameter of 50.8 mm and a thickness of 3 mm was grown similarly as in Example 9.

In GaN crystal 5, matrix crystal region 11 was grown on the sapphire substrate (ground substrate 1). On the amorphous SiO$_2$ layer (mask layer 2), c-axis reversed crystal regions 13t were grown as differently oriented crystal regions 13, which appeared on the crystal surface in square shapes having width W$_1$ of 15 μm and having width W$_2$ of 35 μm, respectively, as shown in FIGS. 7A-7D and 10. Here, a distance L between the centers of the two differently oriented crystal regions 13 (c-axis reversed crystal regions 13t) was 10 mm. Center line 13k passing through the centers of two differently oriented crystal regions 13 was in parallel with orientation <1-100> of the GaN crystal.

As in Example 1, obtained GaN crystal 5 was sliced in parallel with the main surface of ground substrate 1 to produce GaN crystal substrate 10 having a diameter of 50 mm and a thickness of 400 μm. In obtained GaN crystal substrate 10, differently oriented crystal regions 13 penetrated in the thickness direction of GaN crystal substrate 10, and first and second patterns P$_1$ and P$_2$ of differently oriented crystal regions 13 appearing on crystal growth surface 10c and rear surface 10r, respectively, were different from each other in relation to the outer shape of the substrate.

The crystal growth surface and rear surface of GaN crystal substrate 10 were processed similarly as in Example 7. In the processed GaN crystal substrate, roughness Ra$_{(C)}$ of crystal growth surface 10c was 1.7 nm and roughness Ra$_{(R)}$ of rear surface 10r was 1.8 nm. Hence, the front and rear surfaces were not distinguishable from each other by surface roughness Ra. However, with GaN crystal substrate 10, the crystal orientation could be identified by the shape of differently oriented crystal regions 13, and the front and rear surfaces of the substrate were distinguishable from each other since first and second patterns P$_1$ and P$_2$ of differently oriented crystal regions 13 appearing on crystal growth surface 10c and rear surface 10r, respectively, were different from each other in relation to the outer shape of the substrate.

EXAMPLE 12

Figure 8A:
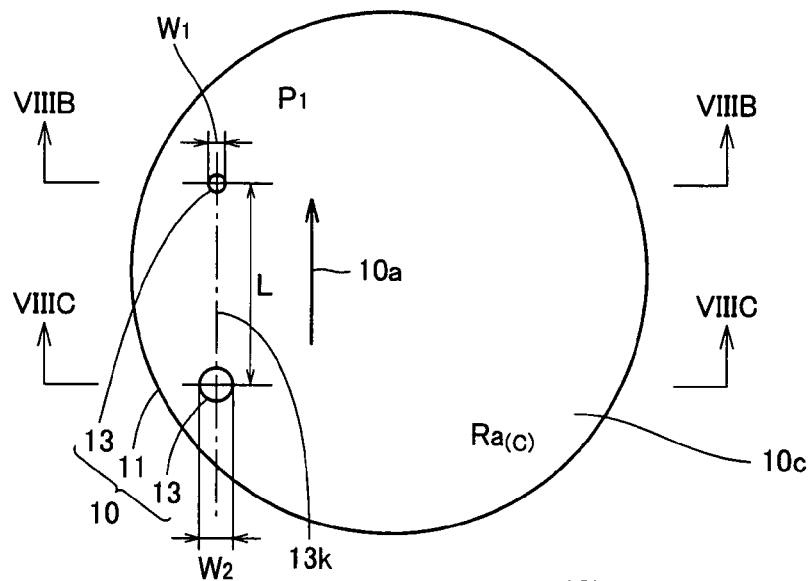
FIG. 8A is a schematic top view showing still another embodiment of a GaN crystal substrate according to the present invention.
Figure 8B:
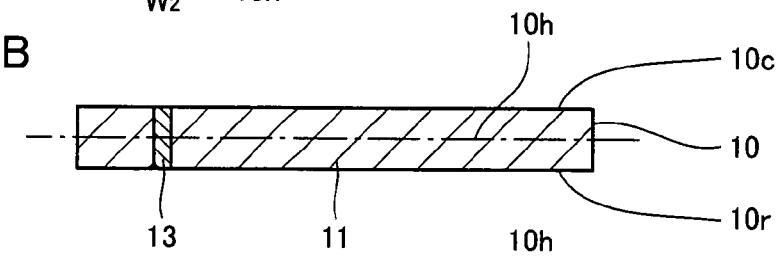
FIG. 8B is a schematic cross-sectional view along VIIIB in FIGS. 8A and 8D.
Figure 8C:
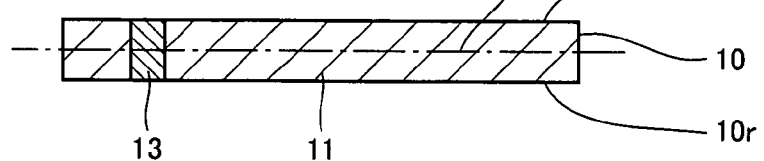
FIG. 8C is a schematic cross-sectional view along VIIIC in FIGS. 8A and 8D.
Figure 8D:
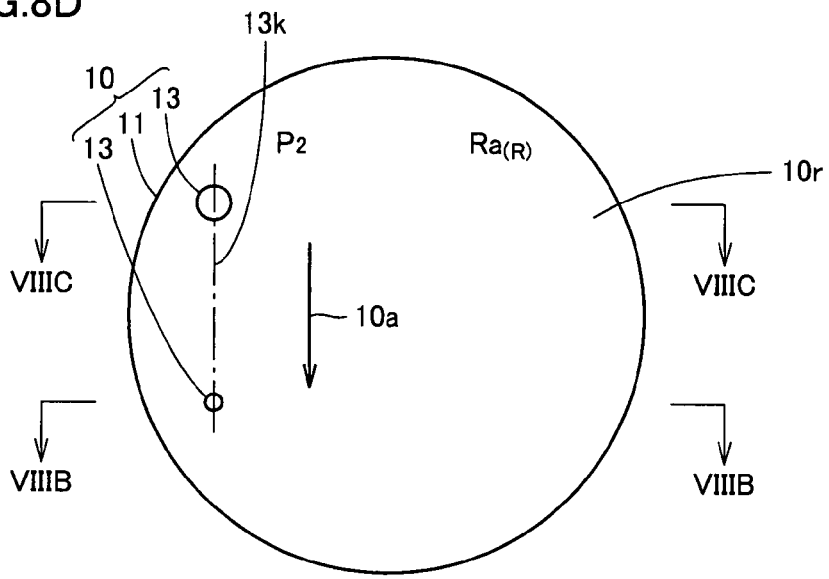
FIG. 8D is a schematic bottom view corresponding to FIG. 8A.

Referring to FIGS. 8A-8D and 10, on a sapphire substrate being ground substrate 1 having a diameter of 50.8 mm and a thickness of 350 μm, by sputtering and photolithography, a circular amorphous SiO$_2$ layer having a diameter W$_1$ of 20 μm and a circular amorphous SiO$_2$ layer having a diameter W$_2$ of 50 μm were formed as mask layers 2 patterned into the same shape as in FIG. 8A. Here, a distance L between the two amorphous SiO$_2$ layers was 10 mm. The two amorphous SiO$_2$ layers were formed such that center line 13k passing through the centers of two amorphous SiO$_2$ layers was parallel with orientation <11-20> of the grown GaN crystal as arbitrarily specified crystal orientation 10a. Next, on the sapphire substrate (ground substrate 1) on which the amorphous SiO$_2$ layers (mask layers 2) patterned into the above-described shape were formed, GaN crystal 5 having a diameter of 50.8 mm and a thickness of 3 mm was grown similarly as in Example 9.

In GaN crystal 5, matrix crystal region 11 was grown on the sapphire substrate (ground substrate 1). On the amorphous SiO$_2$ layer (mask layer 2), c-axis reversed crystal regions 13t were grown as differently oriented crystal regions 13, which appeared on the crystal surface in circular shapes having diameter W$_1$ of 15 μm and having diameter W$_2$ of 45 μm, respectively, as shown in FIGS. 8A-8D and 10. Here, a distance L between two differently oriented crystal regions 13 (c-axis reversed crystal regions 13t) was 10 mm. Center line 13k passing through the centers of two differently oriented crystal regions 13 was in parallel with orientation <11-20> of the GaN crystal.

As in Example 1, obtained GaN crystal 5 was sliced in parallel with the main surface of ground substrate 1 to produce GaN crystal substrate 10 having a diameter of 50 mm and a thickness of 400 μm. In obtained GaN crystal substrate 10, differently oriented crystal regions 13 penetrated in the thickness direction of GaN crystal substrate 10, and first and second patterns P$_1$ and P$_2$ of differently oriented crystal regions 13 appearing on crystal growth surface 10c and rear surface 10r, respectively, were different from each other in relation to the outer shape of the substrate.

The crystal growth surface and rear surface of GaN crystal substrate 10 were processed similarly as in Example 7. In the processed GaN crystal substrate, roughness Ra$_{(C)}$ of crystal growth surface 10c was 1.7 nm and roughness Ra$_{(R)}$ of rear surface 10r was 1.8 nm. Hence, the front and rear surfaces were not distinguishable from each other by surface roughness Ra. However, with GaN crystal substrate 10, the crystal orientation could be identified by the shape of differently oriented crystal regions 13, and the front and rear surfaces of the substrate were distinguishable from each other since first and second patterns P$_1$ and P$_2$ of differently oriented crystal regions 13 appearing on crystal growth surface 10c and rear surface 10r, respectively, were different from each other in relation to the outer shape of the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A GaN crystal substrate, comprising:
a matrix crystal region; and
a differently oriented crystal region including a crystal that is different in at least one crystal axis from a crystal of said matrix crystal region, wherein
said differently oriented crystal region is formed to have a shape indicative of an arbitrarily specified crystal orientation,
said differently oriented crystal region penetrates said substrate in thickness direction,
said substrate has a crystal growth surface on which a crystal is grown, a rear surface opposite to said crystal growth surface, and
a first pattern of said differently oriented crystal region appearing on said crystal growth surface of said substrate and a second pattern of said differently oriented crystal region appearing on said rear surface of said substrate are different from each other in the plane-geometric positional relationship in relation to an outer shape of said substrate.

2. The GaN crystal substrate according to claim 1, wherein said differently oriented crystal region is a c-axis reversed crystal region formed by a crystal that is identical to a crystal of said matrix crystal region in a-axis orientation and that is reverse to the crystal of said matrix crystal region in c-axis orientation.

3. The GaN crystal substrate according to claim 1, wherein said differently oriented crystal region is a polycrystal region including a plurality of crystals that are different from a crystal of said matrix crystal region in a-axis orientation and that are identical to the crystal of said matrix crystal region in c-axis orientation.

4. The GaN crystal substrate according to claim 1, having:
a crystal growth surface on which a crystal is grown; and
a rear surface opposite to said crystal growth surface, wherein
said crystal growth surface has a roughness $Ra_{(C)}$ of at most 10 nm, and
said rear surface has a roughness $Ra_{(R)}$ of at least 0.5 μm and at most 10 μm, and
a ratio $Ra_{(R)}/Ra_{(C)}$ of said surface roughness $Ra_{(R)}$ to said surface roughness $Ra_{(C)}$ is at least 50.

* * * * *